(12) United States Patent
Yamamoto et al.

(10) Patent No.: US 7,382,811 B2
(45) Date of Patent: Jun. 3, 2008

(54) OPTICAL DEVICE, LASER BEAM SOURCE, LASER APPARATUS AND METHOD OF PRODUCING OPTICAL DEVICE

(75) Inventors: Kazuhisa Yamamoto, Takatsuki (JP); Kiminori Mizuuchi, Neyagawa (JP); Yasuo Kitaoka, Kawachinagano (JP); Makoto Kato, Nishinomiya (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 267 days.

(21) Appl. No.: 10/712,635

(22) Filed: Nov. 13, 2003

(65) Prior Publication Data
US 2004/0095973 A1    May 20, 2004

Related U.S. Application Data

(62) Division of application No. 09/922,978, filed on Aug. 6, 2001, now Pat. No. 6,914,918, which is a division of application No. 08/973,380, filed on Mar. 16, 1998, now Pat. No. 6,333,943.

(30) Foreign Application Priority Data

| Jun. 2, 1995 | (JP) | ................................... 7-136471 |
| Jul. 4, 1995 | (JP) | ................................... 7-168461 |

(51) Int. Cl.
*H01S 3/10*    (2006.01)
(52) U.S. Cl. ............................. 372/21; 372/22; 372/26
(58) Field of Classification Search .................. 372/64
See application file for complete search history.

(56) References Cited

U.S. PATENT DOCUMENTS

| 4,665,529 A |   | 5/1987 | Baer et al. |
| 4,667,331 A |   | 5/1987 | Alferness |
| 4,907,238 A |   | 3/1990 | Chun |
| 4,919,506 A | * | 4/1990 | Covey .......................... 385/35 |
| 4,925,263 A | * | 5/1990 | Sanford et al. ............. 385/132 |
| 5,036,220 A | * | 7/1991 | Byer et al. ................... 359/328 |
| 5,042,909 A |   | 8/1991 | Garcia, Jr. et al. |

(Continued)

FOREIGN PATENT DOCUMENTS

JP    58-044785    3/1983

(Continued)

OTHER PUBLICATIONS

Chinese Office Action dated Jul. 10, 2003.

(Continued)

*Primary Examiner*—Dung Nguyen
(74) *Attorney, Agent, or Firm*—RatnerPrestia

(57) ABSTRACT

After forming domain inverted layers 3 in an $LiTaO_3$ substrate 1, an optical waveguide is formed. By performing low-temperature annealing for the optical wavelength conversion element thus formed, a stable proton exchange layer 8 is formed, where an increase in refractive index generated during high-temperature annealing is lowered, thereby providing a stable optical wavelength conversion element. Thus, the phase-matched wavelength becomes constant, and variation in harmonic wave output is eliminated. Consequently, with respect to an optical wavelength conversion element utilizing a non-linear optical effect, a highly reliable element is provided.

9 Claims, 30 Drawing Sheets

U.S. PATENT DOCUMENTS

| | | |
|---|---|---|
| 5,113,524 A | 5/1992 | Hirota |
| 5,130,838 A | 7/1992 | Tanaka et al. |
| 5,177,758 A | 1/1993 | Oka et al. |
| 5,295,218 A | 3/1994 | Agostinelli |
| 5,303,247 A | 4/1994 | Yamamoto et al. |
| 5,415,978 A * | 5/1995 | Asami et al. ............... 430/363 |
| 5,452,312 A | 9/1995 | Yamamoto et al. |
| 5,590,145 A * | 12/1996 | Nitta ...................... 372/50.22 |
| 5,614,961 A | 3/1997 | Gibeau |
| 5,682,398 A * | 10/1997 | Gupta ........................ 372/22 |

FOREIGN PATENT DOCUMENTS

| | | |
|---|---|---|
| JP | 61-22518 | 5/1986 |
| JP | 62-274788 | 11/1987 |
| JP | 2-199975 | 8/1990 |
| JP | 2-221995 | 9/1990 |
| JP | 3-38984 | 2/1991 |
| JP | 3-191332 | 8/1991 |
| JP | 04-000783 | 1/1992 |
| JP | 4-18823 | 2/1992 |
| JP | 4-45478 | 2/1992 |
| JP | 4-100088 | 4/1992 |
| JP | 4-296731 | 10/1992 |
| JP | 4-315120 | 11/1992 |
| JP | 4-507299 | 12/1992 |
| JP | 05-034611 | 2/1993 |
| JP | 5-107421 | 4/1993 |
| JP | 5-173094 | 7/1993 |
| JP | 5-232536 | 9/1993 |
| JP | 05-232605 | 9/1993 |
| JP | 05-249521 | 9/1993 |
| JP | 06-011750 | 1/1994 |
| JP | 06-045669 | 2/1994 |
| JP | 6-18823 U | 3/1994 |
| JP | 6-148444 | 5/1994 |
| JP | 06-258597 | 9/1994 |
| JP | 6-265956 | 9/1994 |
| JP | 6-273814 | 9/1994 |
| JP | 06-295159 | 10/1994 |
| JP | 06-308408 | 11/1994 |
| JP | 6-350168 | 12/1994 |
| JP | 7-15077 | 1/1995 |
| JP | 7-23329 | 4/1995 |
| JP | 07-099360 | 4/1995 |
| JP | 06-194708 | 7/1995 |
| JP | 08-194196 | 7/1996 |
| WO | WO 94/15237 | 7/1994 |

OTHER PUBLICATIONS

Ahfeldt, H., et al., "Postfabrication Changes and Dependence on Hydrogen Concentration of the Refractive Index of Proton-Exchanged Lithium Tantalate Waveguides", pp. 717-727 (Jan. 15, 1994).

Chinese Office Action dated Apr. 29, 2005.

Chinese Office Action dated Jun. 3, 2005.

Chinese Office Action dated Jun. 29, 2005 (first).

Chinese Office Action dated Jun. 29, 2005 (second).

Mizuuchi, K., et al., "Second-Harmonic Generation of Blue Light in a LiTaO3 Waveguide", Applied Physics Letters, vol. 58, No. 24, pp. 2732-2734 (1991).

* cited by examiner

POLARIZATION
DIRECTION

OPTICAL DEVICE, LASER BEAM SOURCE, LASER APPARATUS AND METHOD OF PRODUCING OPTICAL DEVICE

This application is a divisional of U.S. patent application Ser. No. 09/922,978 filed Aug. 6, 2001 now U.S. Pat. No. 6,914,918 which is a divisional of U.S. patent application Ser. No. 08/973,380 filed Mar. 16, 1998, now U.S. Pat. No. 6,333,943. The entire disclosures of U.S. patent application Ser. No. 09/922,978 filed Aug. 6, 2001 and U.S. Pat. No. 6,333,943 are expressly incorporated by reference herein.

TECHNICAL FIELD

The present invention relates to an optical element such as an optical wavelength conversion element, a laser light source and a laser device suitable for use in the field of optical information processing or optical measuring control where coherent light is used, and also relates to a method for producing an optical element.

BACKGROUND ART

Referring to FIG. 1, a conventional laser light source using an optical wavelength conversion element will be described. The laser light source is basically composed of a semiconductor laser 20, a solid state laser crystal 21 and an optical wavelength conversion element 25 made of $KNbO_3$, which is a non-linear optical crystal.

As shown in FIG. 1, pumped light P1a emitted from the semiconductor laser 20, which oscillates at 807 nm, is collected by a lens 30 so as to excite YAG as a solid state laser crystal 21. A total reflection mirror 22 is formed on an incident surface of the solid state laser crystal 21. The total reflection mirror reflects 99% of light having a wavelength of 947 nm but transmits light in the 800 nm wavelength band. Although the pumped light P1a is thus efficiently introduced into the solid state laser crystal 21, the light with a wavelength of 947 nm, which is generated by the solid state laser crystal 21, is reflected to the optical wavelength conversion element 25 side without being emitted to the semiconductor laser 20 side. Moreover, a mirror 23, which reflects 99% of light having a wavelength of 947 nm but transmits light in the 400 nm wavelength band, is provided on the output side of the optical wavelength conversion element 25. These mirrors 22 and 23 form a resonator (cavity) for light having a wavelength of 947 nm, capable of generating oscillation at 947 nm as a fundamental wave P1.

The optical wavelength conversion element 25 is inserted in the cavity defined by the mirrors 22 and 23, whereby a harmonic wave P2 is generated. The power of the fundamental wave P1 within the cavity reaches to 1 W or higher. Therefore, the conversion from the fundamental wave P1 to the harmonic wave P2 is increased, whereby a harmonic wave having a high power can be obtained. A harmonic wave of 1 mW can be obtained by using a semiconductor laser having an output of 500 mW.

Next, referring to FIG. 2, a conventional optical wavelength conversion element having an optical waveguide will be described. The illustrated optical wavelength conversion element, when a fundamental wave having a wavelength of 840 nm is incident thereupon, generates a secondary harmonic wave (wavelength: 420 nm) corresponding to the fundamental wave. Such an optical wavelength conversion element is disclosed in K. Mizuuchi, K. Yamamoto and T. Taniuchi, Applied Physics Letters, Vol 58, p. 2732, June 1991.

As shown in FIG. 2, in this optical wavelength conversion element, an optical waveguide 2 is formed in an $LiTaO_3$ substrate 1, with layers whose polarization is inverted (domain inverted layers) 3 being periodically arranged along the optical waveguide 2. Portions of the $LiTaO_3$ substrate 1 where the domain inverted layer 3 is not formed will serve as a domain non-inverted layer 4.

When the fundamental wave P1 is incident upon one end (an incident surface 10) of the optical waveguide 2, the harmonic wave P2 is created in the optical wavelength conversion element and is output from the other end of the optical waveguide 2. At this point, light propagating through the optical waveguide 2 is influenced by a periodic structure formed by the domain inverted layers 3 and the domain non-inverted layer 4, whereby propagation constant mismatching between the generated harmonic wave P2 and the fundamental wave P1 is compensated by the periodic structure of the domain inverted layers 3 and the domain non-inverted layer 4. As a result, the optical wavelength conversion element is able to output the harmonic wave P2 with a high efficiency.

Such an optical wavelength conversion element includes, as a basic component, the optical waveguide 2 produced by a proton exchange method.

Hereinafter, referring to FIG. 3, a method for producing such an optical wavelength conversion element will be described.

First, at step S10 in FIG. 3, a domain inverted layer formation step is performed.

More particularly, a Ta film is first deposited so as to cover the principal surface of the $LiTaO_3$ substrate 1, after which ordinary photolithography and dry etching techniques are used to pattern the Ta film into a striped pattern, thereby forming the Ta mask.

Next, a proton exchange process is performed at 260° C. for 20 minutes for the $LiTaO_3$ substrate 1 whose principal surface is covered by the Ta mask. Thus, 0.5 µm thick proton exchange layers are formed in portions of the $LiTaO_3$ substrate 1 which are not covered by the Ta mask. Then, the Ta mask is removed by etching for 2 minutes using a mixture containing $HF:HNF_3$ at 1:1.

Next, a domain inverted layer is formed within each of the proton exchange layers by performing a heat treatment at 550° C. for 1 minute. In the heat treatment, the temperature rise rate is 50° C./sec and the cooling rate is 10° C./sec. In portions of the $LiTaO_3$ substrate 1 where the proton exchange has been performed, the amount of Li is reduced as compared to that in other portions thereof where the proton exchange has not been performed. Therefore, the Curie temperature of the proton exchange layer decreases, whereby the domain inverted layer can be formed partially in the proton exchange layer at a temperature of 550° C. This heat treatment allows for formation of the proton exchange layer having a pattern upon which the pattern of the Ta mask is reflected.

Next, at step 2 in FIG. 3, an optical waveguide formation step is performed.

More particularly, step 2 is generally divided into step S21, step S22 and step S23. The mask pattern is formed at step S21; the proton exchange process is performed at step S22; and high-temperature annealing is performed at step S23.

These steps will be described below.

At step S21, the Ta mask used for forming the optical waveguide is formed. The Ta mask is obtained by forming slit-shaped openings (width: 4 µm, length: 12 mm) in a Ta film. At step S22, a high refractive index layer (thickness:

0.5 μm) linearly extending in one direction is formed in the LiTaO$_3$ substrate 1 by performing a proton exchange process at 260° C. for 16 minutes for the LiTaO$_3$ substrate 1 which is covered by the Ta mask. The high refractive index layer will eventually function as an optical waveguide. However, the non-linearity of the portions where the proton exchange has been performed (the high refractive index layers), as thus formed, is deteriorated. In order to restore the non-linearity, annealing is performed at 420° C. for 1 minute at step S22 after removing the Ta mask. This annealing expands the high refractive index layer in the vertical direction and in the lateral direction, thereby diffusing Li into the high refractive index layers. By reducing the proton exchange concentration in the high refractive index layers in this way, it is possible to restore the non-linearity. As a result, the refractive index of the regions located directly under the slits of the Ta mask (the high refractive index layers) is increased by about 0.03 from the refractive index in other regions, whereby the high refractive index layers function as an optical waveguide.

Next, a protective film formation step (step S30), an end face polishing step (step S40), and an AR coating step (step S50) are performed, thereby completing an optical wavelength conversion element.

By setting the arrangement pitch of the domain inverted layers periodically arranged along the waveguide to 10.8 μm, it is possible to form a third-order pseudo phase-matched structure.

With the above-described optical wavelength conversion element, when the length of the optical waveguide 2 is set to 9 mm, the harmonic wave P2 having a power of 0.13 mW can be obtained for the fundamental wave P1 (power: 27 mW) having a wavelength of 840 nm (conversion efficiency: 0.5%).

For forming a first-order pseudo phase-matched structure, the arrangement pitch of the domain inverted layers can be set to 3.6 μm. In this case, the harmonic wave P2 of 0.3 mW can be obtained for the fundamental wave P1 of 27 mW (conversion efficiency: 1%). The inventors of the present invention have experimentally produced a laser light source which outputs blue laser light by combining such an optical wavelength conversion element with a semiconductor laser.

Such an optical wavelength conversion element has a problem that the phase-matched wavelength thereof varies with the passage of time, whereby a harmonic wave cannot be obtained. When the wavelength of the fundamental wave emitted from a semiconductor laser is kept constant, but the phase-matched wavelength of the optical wavelength conversion element is shifted, the harmonic wave output will gradually decrease, and it will eventually becomes zero.

The object of the present invention is to stabilize a laser light source, to increase the output thereof, and to reduce the size and weight of a laser device or an optical disk apparatus by incorporating a high output laser light source into these devices/apparatuses.

DISCLOSURE OF THE INVENTION

A method for producing an optical element of the present invention includes: a step of forming a proton exchange layer in an LiNb$_x$Ta$_{1-x}$O$_3$ (0≦X≦1) substrate; and an annealing step of performing a heat treatment for the substrate at a temperature of 120° C. or lower for 1 hour or more.

Preferably, the annealing step is performed at a temperature equal to or higher than 50° C. but lower than or equal to 90° C.

The annealing step may include a step of gradually lowering the temperature.

In one embodiment, the step of forming the proton exchange layer includes: a step of performing a proton exchange process for the substrate; and a step of performing a heat treatment for the substrate at a temperature of 150° C. or higher.

In one embodiment, the step of forming the proton exchange layer includes: a step of forming a plurality of periodically-arranged domain inverted layers in the substrate; and a step of forming an optical waveguide on a surface of the substrate.

Another method for producing an optical element of the present invention includes: a step of performing a proton exchange process for an LiNb$_x$Ta$_{1-x}$O$_3$ (0≦X≦1) substrate; and an annealing step of performing a plurality of heat treatments including at least first and second heat treatments for the substrate. The temperature of the second annealing is lower than the temperature of the first annealing by 200° C. or more.

Preferably, the second annealing is performed at a temperature equal to or higher than 50° C. but lower than or equal to 90° C.

An optical element of the present invention includes an LiNb$_x$Ta$_{1-x}$O$_3$ (0≦X≦1) substrate and a proton exchange layer formed in the substrate. The optical element is formed of a stable proton exchange layer such that a refractive index of the proton exchange layer does not vary with time during operation.

In one embodiment, at least a portion of the proton exchange layer forms an optical waveguide.

A light source of the present invention includes: a semiconductor laser; and an optical wavelength conversion element for receiving laser light emitted from the semiconductor laser so as to convert the laser light to a harmonic wave. The optical wavelength conversion element includes: an optical waveguide for guiding the laser light; and domain inverted structures periodically arranged along the optical waveguide, the optical waveguide and the domain inverted structures being formed of a stable proton exchange layer whose refractive index does not vary with time during operation.

Another laser light source of the present invention includes: a semiconductor laser for emitting a fundamental wave; a single mode fiber for conveying the fundamental wave; and an optical wavelength conversion element for receiving the fundamental wave emitted from the fiber so as to generate a harmonic wave, the optical wavelength conversion element having periodic domain inverted structures.

In one embodiment, the optical wavelength conversion element has a modulation function.

Preferably, the optical wavelength conversion element is formed in an LiNb$_x$Ta$_{1-x}$O$_3$ (0≦X≦1) substrate.

Still another laser light source of the present invention includes: a semiconductor laser for emitting a pumped light; a fiber for conveying the pumped light; a solid state laser crystal for receiving the pumped light emitted from the fiber so as to generate a fundamental wave; and an optical wavelength conversion element for receiving the fundamental wave so as to generate a harmonic wave, the optical wavelength conversion element having periodic domain inverted structures.

Preferably, the optical wavelength conversion element has a modulation function.

Preferably, the optical wavelength conversion element is formed in an LiNb$_x$Ta$_{1-x}$O$_3$ (0≦X≦1) substrate.

In one embodiment, the solid state laser crystal and the optical wavelength conversion element are integrated together.

Still another laser light source of the present invention includes: a semiconductor laser for emitting a pumped light; a solid state laser crystal for receiving the pumped light so as to generate a fundamental wave; a single mode fiber for conveying the fundamental wave; and an optical wavelength conversion element for receiving the fundamental wave from the fiber so as to generate a harmonic wave, the optical wavelength conversion element having periodic domain inverted structures.

Preferably, the optical wavelength conversion element has a modulation function.

Still another laser light source of the present invention includes: a distributed feedback type semiconductor laser for emitting laser light; a semiconductor laser amplifier for amplifying the laser light; and an optical wavelength conversion element for receiving the amplified laser light so as to generate a harmonic wave, the optical wavelength conversion element having periodic domain inverted structures.

Preferably, the optical wavelength conversion element has a modulation function.

Preferably, the optical wavelength conversion element is formed in an $LiNb_xTa_{1-x}O_3$ ($0 \leq X \leq 1$) substrate.

In one embodiment, the semiconductor laser is wavelength-locked.

Still another laser light source of the present invention includes: a semiconductor laser for emitting laser light; and an optical wavelength conversion element in which periodic domain inverted structures and an optical waveguide are formed. The width and the thickness of the optical waveguide are each 40 μm or greater.

The optical wavelength conversion element of a laser light source has a modulation function.

The optical wavelength conversion element is formed in an $LiNb_xTa_{1-x}O_3$ ($0 \leq X \leq 1$) substrate.

In one embodiment, the optical waveguide is of a graded type.

A laser device of the present invention includes: a laser light source having a semiconductor laser for radiating laser light and an optical wavelength conversion element for generating a harmonic wave based on the laser light; a modulator for modulating an output intensity of the harmonic wave; and a deflector for changing a direction of the harmonic wave emitted from the laser light source. Periodic domain inverted structures are formed in the optical wavelength conversion element.

In one embodiment, a harmonic wave is superimposed over the semiconductor laser during operation.

In one embodiment, the laser light source includes a single mode fiber for conveying laser light from the semiconductor laser to the optical wavelength conversion element.

In one embodiment, the laser light source includes: a fiber for conveying laser light from the semiconductor laser; and a solid state laser crystal for receiving laser light emitted from the fiber so as to generate a fundamental wave.

In one embodiment, the semiconductor laser device is a distributed feedback type semiconductor laser; and the laser light source further comprises a semiconductor laser amplifier for amplifying the laser light from the distributed feedback type semiconductor laser.

In one embodiment, an optical waveguide is formed in the optical wavelength conversion element; and the width and the thickness of the optical waveguide are each 40 μm or greater.

Another laser device of the present invention includes: a laser light source for radiating modulated ultraviolet laser light; and a deflector for changing a direction of the ultraviolet laser light. The deflector irradiates a screen with the ultraviolet laser light so as to generate red, green or blue light from a fluorescent substance being applied on the screen.

In one embodiment, the laser light source includes: a semiconductor laser; an optical wavelength conversion element for generating a harmonic wave; and a single mode fiber for conveying laser light from the semiconductor laser to the optical wavelength conversion element.

In one embodiment, the laser light source includes: a semiconductor laser; a fiber for conveying laser light from the semiconductor laser; a solid state laser crystal for receiving laser light emitted from the fiber so as to generate a fundamental wave; and an optical wavelength conversion element for generating a harmonic wave from the fundamental wave.

In one embodiment, the laser light source further includes: a semiconductor laser; and a semiconductor laser amplifier for amplifying laser light from a distributed feedback type semiconductor laser.

In one embodiment, the laser light source includes: a semiconductor laser for emitting laser light; and an optical wavelength conversion element in which an optical waveguide for guiding the laser light and periodic domain inverted structures are formed. The width and the thickness of the optical waveguide are each 40 μm or greater.

Still another laser device of the present invention includes: three laser light sources for generating red, green and blue laser light beams; a modulator for changing an intensity of each of the laser light beams; and a deflector for changing a direction of each of the laser light beams. The laser light source is formed of a semiconductor laser.

In one embodiment, a harmonic wave is superimposed over the semiconductor laser during operation.

In one embodiment, the laser light source includes: a semiconductor laser; an optical wavelength conversion element for generating a harmonic wave; and a single mode fiber for conveying laser light from the semiconductor laser to the optical wavelength conversion element.

In one embodiment, the laser light source includes: a semiconductor laser; a fiber for conveying laser light from the semiconductor laser; a solid state laser crystal for receiving laser light emitted from the fiber so as to generate a fundamental wave; and an optical wavelength conversion element for generating a harmonic wave from the fundamental wave.

In one embodiment, the laser light source further includes: a semiconductor laser; and a semiconductor laser amplifier for amplifying laser light from a distributed feedback type semiconductor laser.

In one embodiment, the laser light source includes: a semiconductor laser for emitting laser light; and an optical wavelength conversion element in which an optical waveguide for guiding the laser light and periodic domain inverted structures are formed. The width and the thickness of the optical waveguide are each 40 μm or greater.

Still another laser device of the present invention includes: at least one laser light source including a semiconductor laser; a sub-semiconductor laser; a modulator for changing an intensity of light from the laser light source; a screen; and a deflector for changing a direction of light from the laser light source so as to scan the screen with the light. Light emitted from the sub-semiconductor laser scans a peripheral portion of the screen; and radiation of laser light from the laser light source is terminated when an optical path of the light emitted from the sub-semiconductor laser is blocked.

In one embodiment, the laser light source includes: an optical wavelength conversion element for generating a harmonic wave; and a single mode fiber for conveying laser light from the semiconductor laser to the optical wavelength conversion element.

In one embodiment, the laser light source includes: the semiconductor laser; a fiber for conveying laser light from the semiconductor laser; a solid state laser crystal for receiving laser light emitted from the fiber so as to generate a fundamental wave; and an optical wavelength conversion element for generating a harmonic wave from the fundamental wave.

In one embodiment, the semiconductor laser is a distributed feedback type semiconductor laser; and the laser light source further includes a semiconductor laser amplifier for amplifying laser light from the distributed feedback type semiconductor laser.

In one embodiment, the laser light source includes an optical wavelength conversion element in which an optical waveguide for guiding laser light from the semiconductor laser and periodic domain inverted structures are formed. The width and the thickness of the optical waveguide are each 40 μm or greater.

A laser device of the present invention includes: at least one laser light source including a semiconductor laser; a deflector for changing a direction of laser light radiated from the laser light source so as to scan the screen with the laser light. The device further comprises two or more detectors for generating a signal when receiving a portion of the laser; and generation of laser light from the laser light source is terminated when the detector does not generate a signal for a certain period of time while the deflector scans the screen with the laser light.

In one embodiment, the laser light source includes: an optical wavelength conversion element for generating a harmonic wave; and a single mode fiber for conveying laser light from the semiconductor laser to the optical wavelength conversion element.

In one embodiment, the laser light source includes: the semiconductor laser; a fiber for conveying laser light from the semiconductor laser; a solid state laser crystal for receiving laser light emitted from the fiber so as to generate a fundamental wave; and an optical wavelength conversion element for generating a harmonic wave from the fundamental wave.

In one embodiment, the semiconductor laser is a distributed feedback type semiconductor laser; and the laser light source further includes a semiconductor laser amplifier for amplifying laser light from the distributed feedback type semiconductor laser.

In one embodiment, the laser light source includes an optical wavelength conversion element in which an optical waveguide for guiding laser light from the semiconductor laser and periodic domain inverted structures are formed. The width and the thickness of the optical waveguide are each 40 μm or greater.

Still another laser device of the present invention includes: at least one laser light source including a semiconductor laser; a modulator for changing an intensity of each laser light; and a deflector for changing a direction of each laser light. Laser light emitted from the laser light source is split into two or more optical paths so as to irradiate a screen from two directions.

In one embodiment, the laser light source includes: an optical wavelength conversion element for generating a harmonic wave; and a single mode fiber for conveying laser light from the semiconductor laser to the optical wavelength conversion element.

In one embodiment, the laser light source includes: the semiconductor laser; a fiber for conveying laser light from the semiconductor laser; a solid state laser crystal for receiving laser light emitted from the fiber so as to generate a fundamental wave; and an optical wavelength conversion element for generating a harmonic wave from the fundamental wave.

In one embodiment, the semiconductor laser is a distributed feedback type semiconductor laser; and the laser light source further includes a semiconductor laser amplifier for amplifying laser light from the distributed feedback type semiconductor laser.

In one embodiment, the laser light source includes an optical wavelength conversion element in which an optical waveguide for guiding laser light from the semiconductor laser and periodic domain inverted structures are formed. The width and the thickness of the optical waveguide are each 40 μm or greater.

In one embodiment, two optical paths are formed by two laser light sources; and the laser light sources respectively experience different modulations.

In one embodiment, the two optical paths are switched with each other based on time.

Still another laser device of the present invention includes at least one laser light source including a semiconductor laser; a first optical system for setting laser light emitted from the laser light source into a parallel beam; a liquid crystal cell for spatially modulating the parallel beam; and a second optical system for irradiating a screen with light emitted from the liquid crystal cell.

In one embodiment, the laser light source includes: an optical wavelength conversion element for generating a harmonic wave; and a single mode fiber for conveying laser light from the semiconductor laser to the optical wavelength conversion element.

In one embodiment, the laser light source includes: the semiconductor laser; a fiber for conveying laser light from the semiconductor laser; a solid state laser crystal for receiving laser light emitted from the fiber so as to generate a fundamental wave; and an optical wavelength conversion element for generating a harmonic wave from the fundamental wave.

In one embodiment, the semiconductor laser is a distributed feedback type semiconductor laser; and the laser light source further includes a semiconductor laser amplifier for amplifying laser light from the distributed feedback type semiconductor laser.

In one embodiment, the laser light source includes an optical wavelength conversion element in which an optical waveguide for guiding laser light from the semiconductor laser and periodic domain inverted structures are formed. The width and the thickness of the optical waveguide are each 40 μm or greater.

In one embodiment, the sub-semiconductor laser is an infrared laser.

In one embodiment, laser light radiation is terminated by shifting a phase-matched wavelength of the optical wavelength conversion element.

An optical disk apparatus of the present invention includes: a laser light source for generating laser light; an optical wavelength conversion element for converting a fundamental wave to a harmonic wave; an optical pickup incorporating therein the optical wavelength conversion element; and an actuator for moving the optical pickup. The laser light radiated from the laser light source is incident upon the optical pickup via an optical fiber.

In one embodiment, the laser light source includes a semiconductor laser disposed outside the optical pickup.

In one embodiment, the laser light source further includes a solid state laser crystal for generating a fundamental wave using laser light emitted from the semiconductor laser as pumped light.

In one embodiment, the solid state laser crystal is disposed outside the optical pickup; and the fundamental wave generated by the solid state laser medium is incident upon the optical wavelength conversion element via the optical fiber.

In one embodiment, the solid state laser crystal is disposed inside the optical pickup; and the laser light emitted from the semiconductor laser is incident upon the solid state laser via the optical fiber.

BEST MODE FOR CARRYING OUT THE INVENTION

The inventors of the present invention studied, with respect to the above-described optical wavelength conversion element having an optical waveguide, the cause of why the phase-matched wavelength thereof becomes shorter with the passage of time, whereby a harmonic wave cannot be generated.

Figure 1:
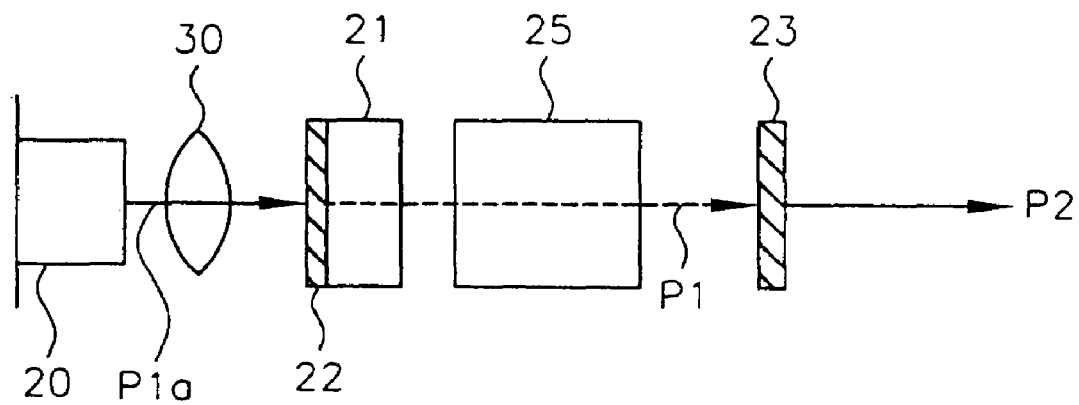
FIG. 1 is a diagram illustrating a conventional short wavelength light source.
Figure 2:
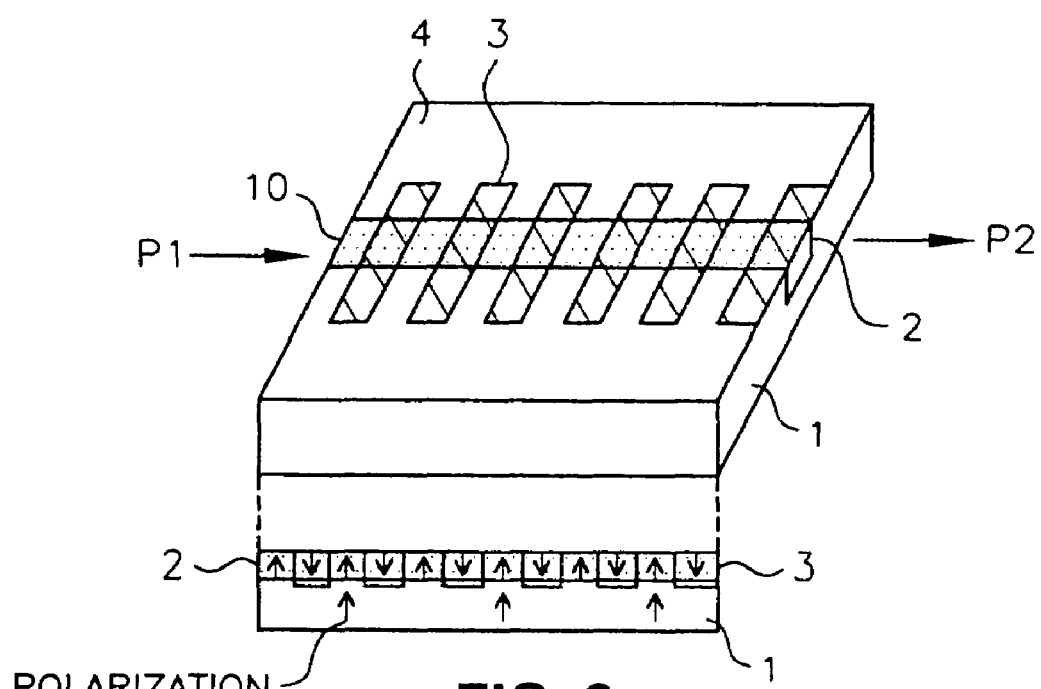
FIG. 2 is a diagram illustrating a structure of a conventional optical wavelength conversion element.
Figure 3:
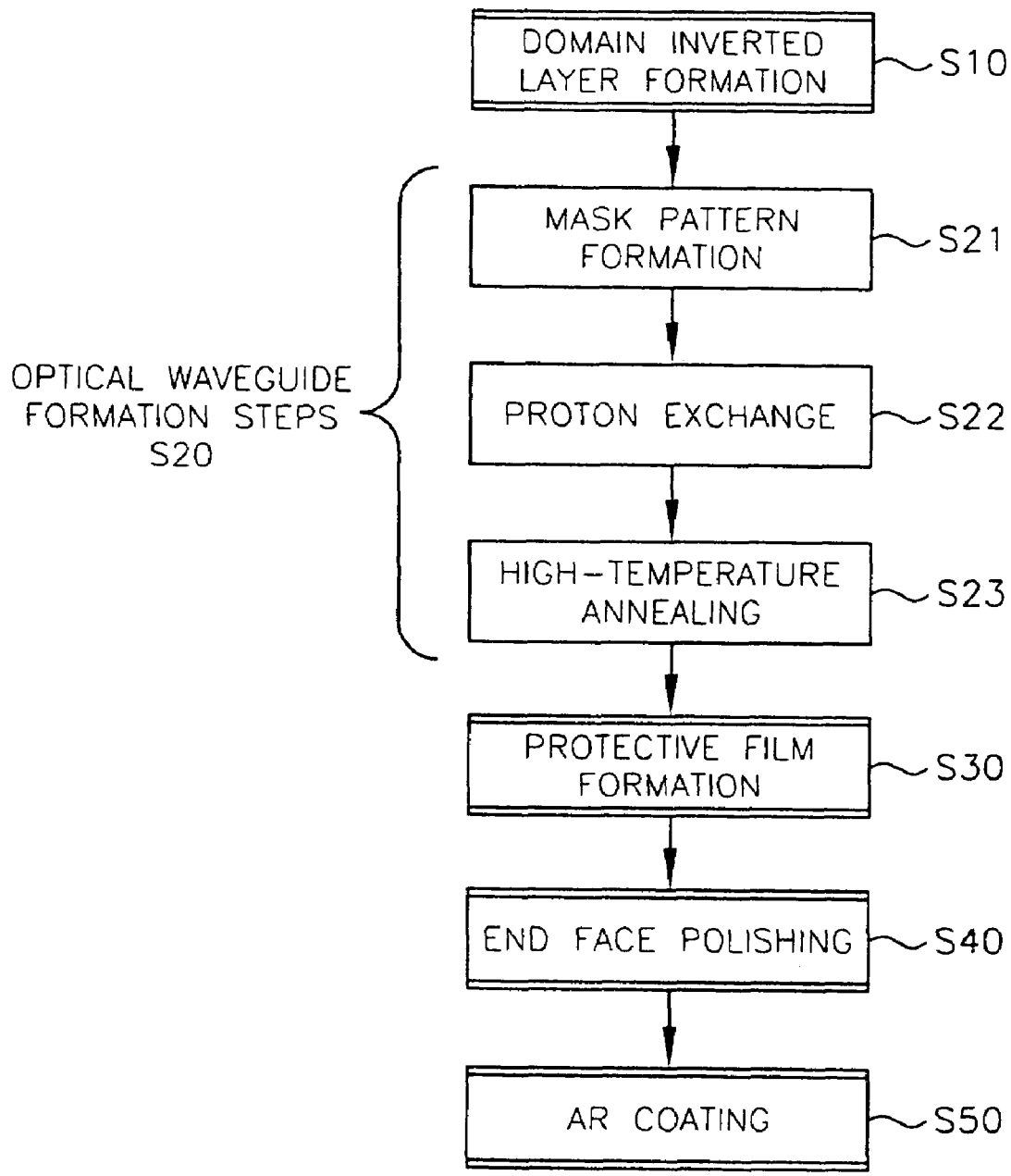
FIG. 3 is a flow chart illustrating steps of a method for producing an optical wavelength conversion element according to a conventional method.
Figure 4:
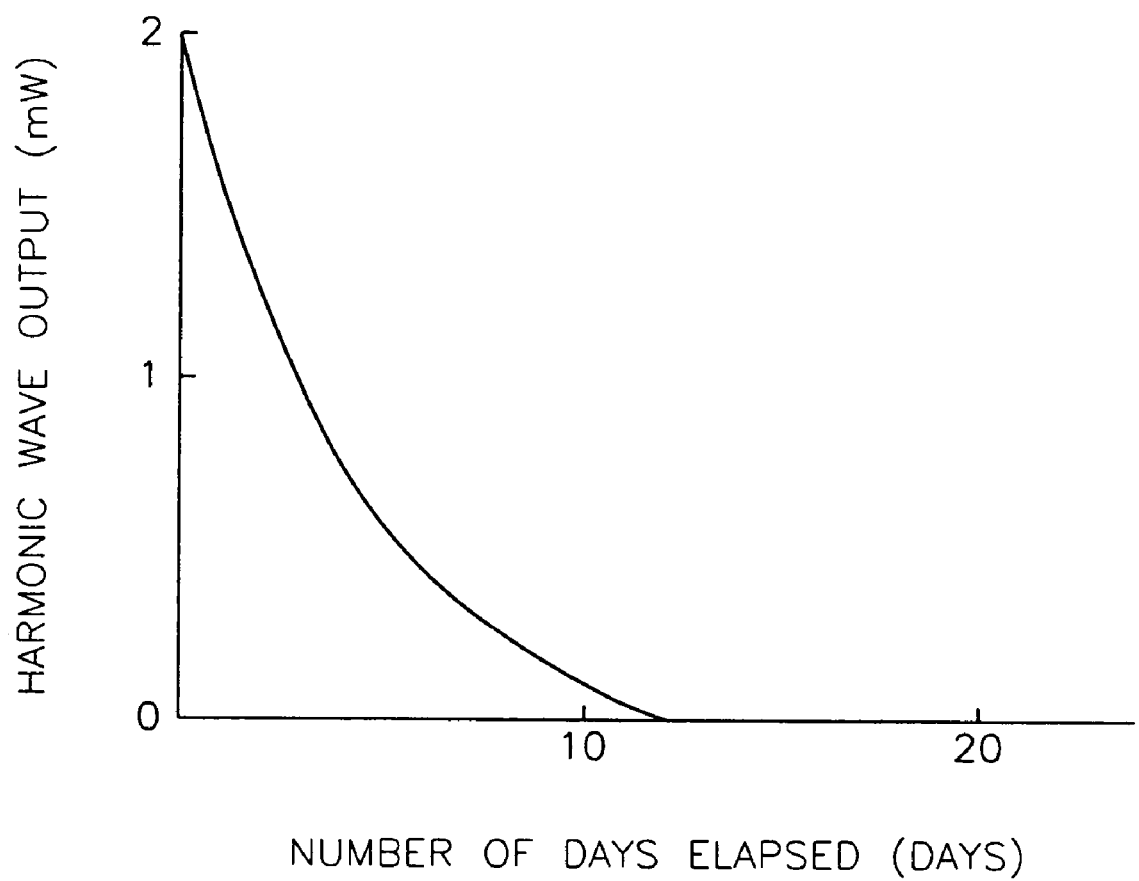
FIG. 4 is a graph illustrating temporal variation of a harmonic wave output of the conventional optical wavelength conversion element.

FIG. 4 illustrates the relationship in the conventional optical wavelength conversion element between the elapsed time immediately after the production of the element and the harmonic wave output thereof. It can be seen that the harmonic wave output rapidly decreases with the passage of time.

Figure 5:
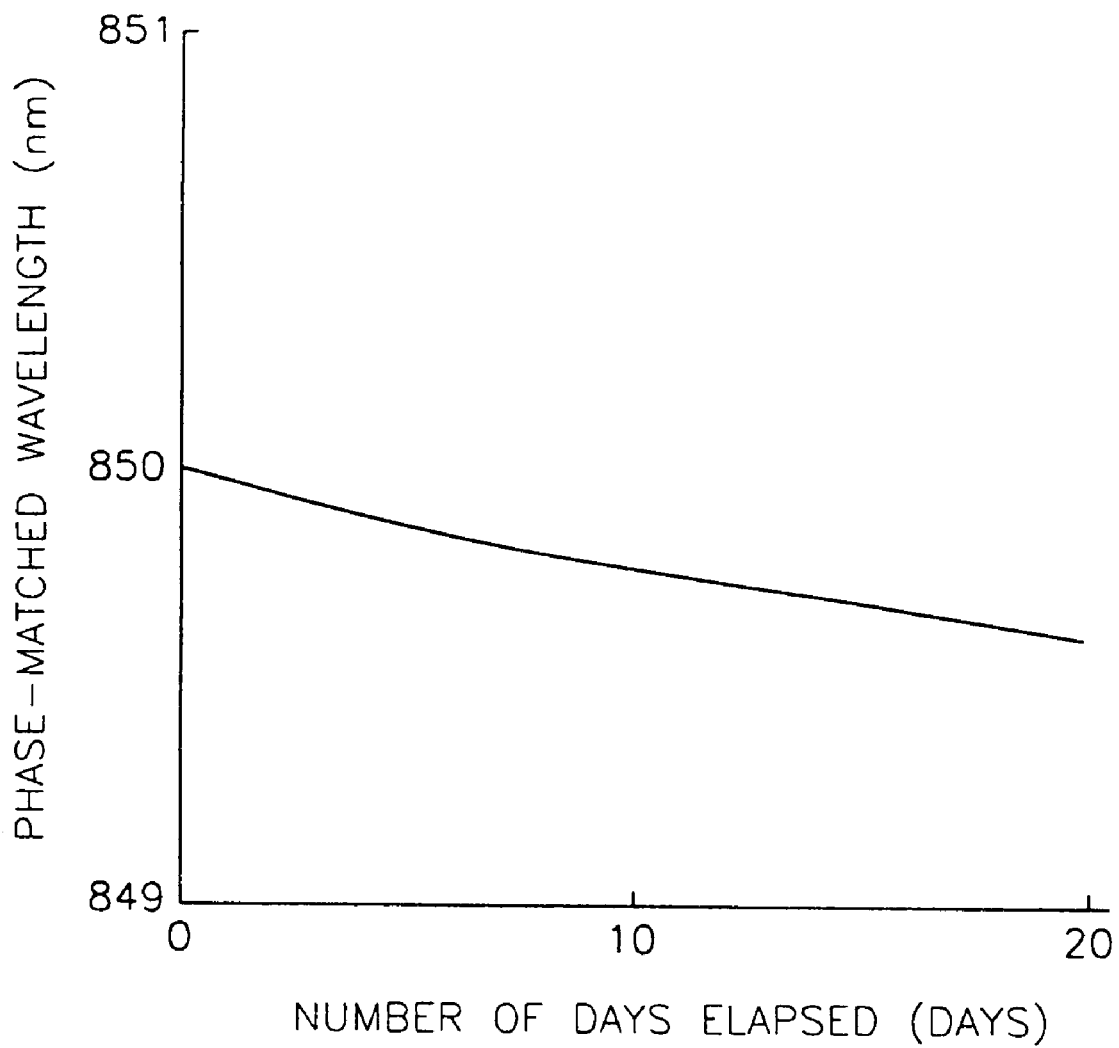
FIG. 5 is a graph illustrating temporal variation of a phase-matched wavelength of the conventional optical wavelength conversion element.

FIG. 5 illustrates the relationship between the elapsed time and the phase-matched wavelength. The harmonic wave output decreases to half after 3 days from immediately after the production of the element. It can be seen that, at this point of time, the phase-matched wavelength has shifted toward the short wavelength side. The phase-matched wavelength λ is defined by a domain inversion pitch Λ and effective refractive indices $n_{2W}$ and $n_W$ respectively for a harmonic wave and a fundamental wave. More particularly, $\lambda=2 (n_{2W}-n_W)\cdot\Lambda$.

Since the pitch Λ of domain inverted layers does not vary with time but is kept constant, the decrease in the phase-matched wavelength λ is considered to result from variation in the effective refractive indices $n_{2W}$ and $n_W$.

Figure 6:
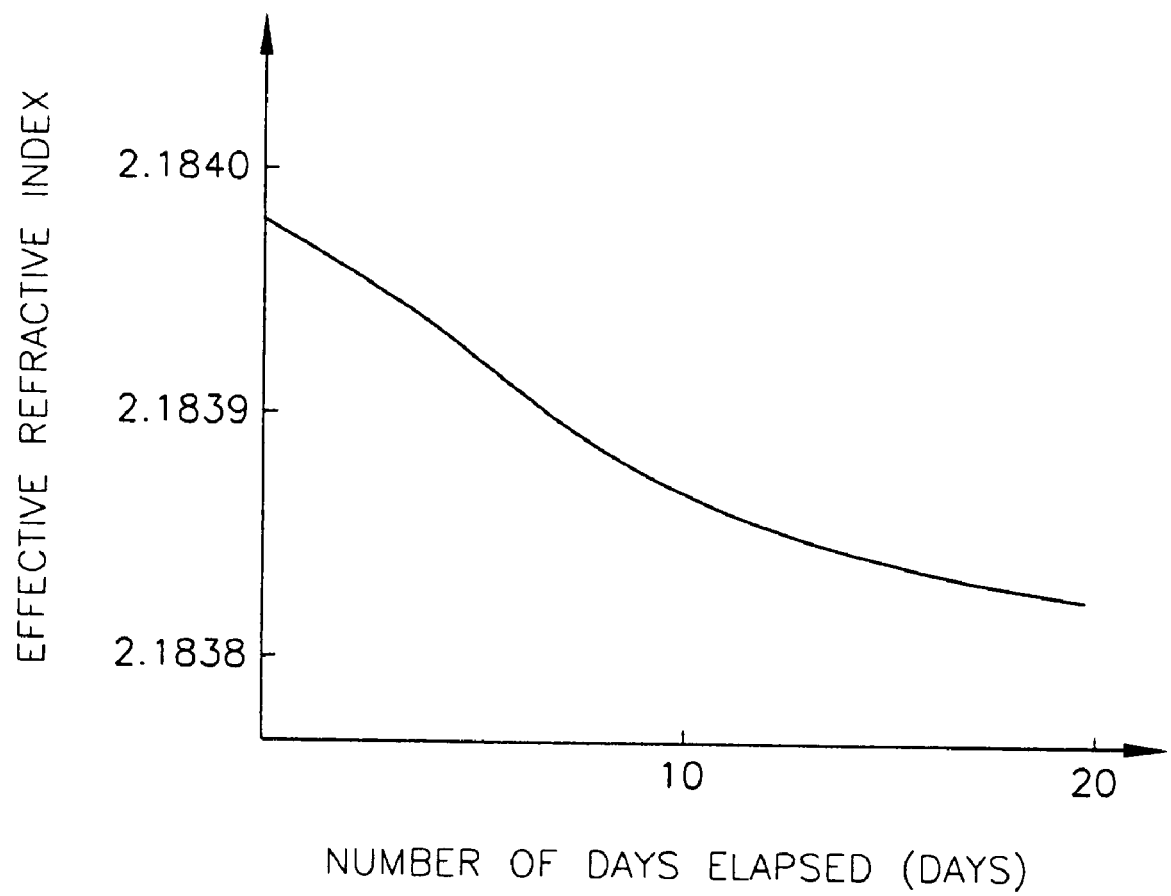
FIG. 6 is a graph illustrating temporal variation of a refractive index of a conventional optical element.

FIG. 6 illustrates the relationship between the effective refractive index $n_{2W}$ and the elapsed time. It can be seen from FIG. 6 that the effective refractive index $n_{2W}$ decreases as more days elapse from the day when the element was produced.

The inventors of the present invention consider the cause therefor to be as follows.

The high temperature treatment at about 400° C. which is performed when forming an optical waveguide introduces some strain, or the like, into a proton exchange layer, whereby a layer with an increased refractive index (the altered layer) is formed in the proton exchange layer. The strain is released gradually with the passage of time, so that the refractive index of the altered layer becomes closer to the original refractive index thereof.

Although the altered layer with an increased refractive index is formed due to the strain, or the like, which is generated during the high temperature annealing, the refractive index of the altered layer returns to the original magnitude thereof and, eventually, the altered layer becomes a stable proton exchange layer. However, it takes years for the altered layer to become such a stable proton exchange layer. In the specification of the present application, a proton exchange layer whose effective refractive index does not decrease with time, when used at an ordinary temperature (about 0° C. to about 50° C.), is referred to as a "stable proton exchange layer".

The above is the mechanism for the temporal variation suggested by the inventors of the present invention. In order to confirm this, a sample whose refractive index has lowered due to the temporal variation was annealed at 300° C. for 1 minute. Such annealing temperature and annealing time will scarcely cause diffusion of proton, etc., and the waveguide will not be widened. Therefore, from the conventional point of view, the refractive index of the proton exchange layer should not vary at all. However, in an experiment by the inventors, the refractive index increased again by the annealing at 300° C. for 1 minute. Moreover, a phenomenon was observed where the refractive index decreased again with the passage of time after this annealing.

The present invention makes it possible to mitigate the strain generated in the proton exchange layer due to a heat treatment at a relatively high temperature, and thus to prevent the temporal variation of the optical wavelength conversion element.

Hereinafter, examples will be described with reference to the accompanying drawings.

EXAMPLE 1

Figure 7:
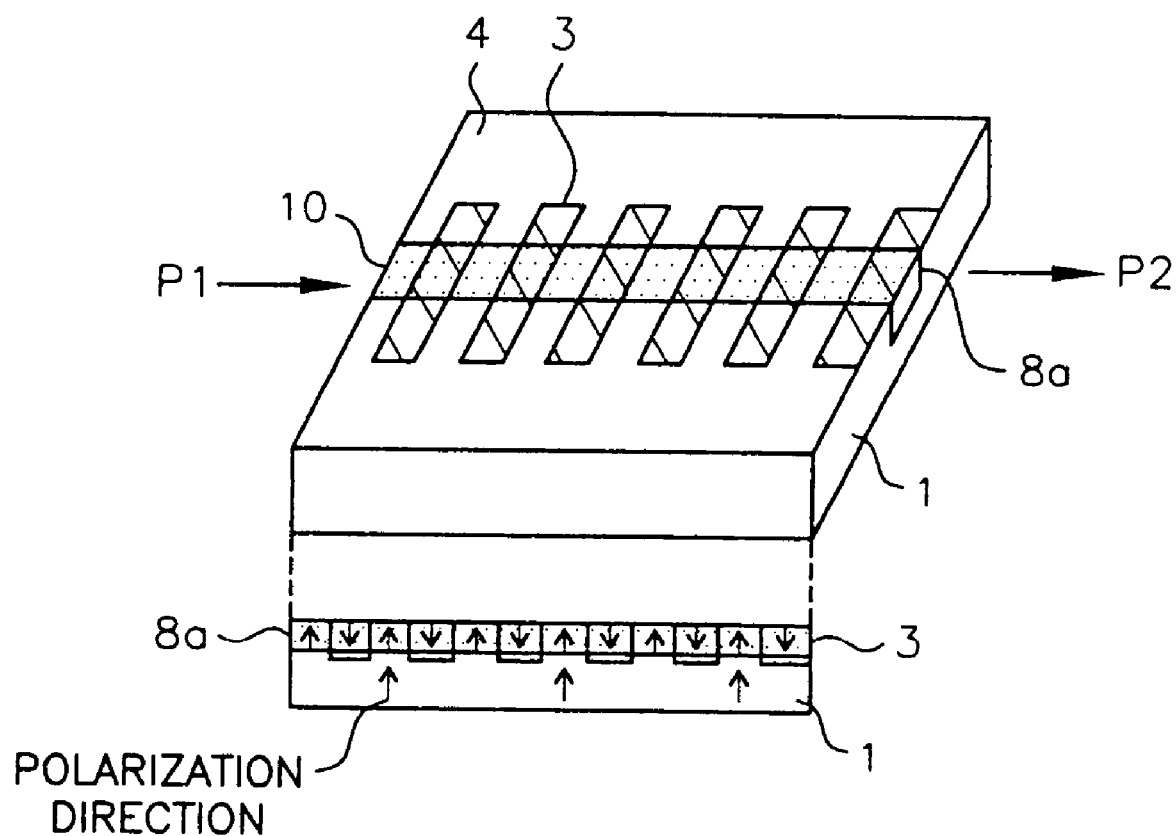
FIG. 7 is a diagram illustrating a structure of an optical wavelength conversion element according to Example 1 of the present invention.

Referring to FIG. 7, Example 1 of the present invention will be described.

In an optical wavelength conversion element of the present example, an optical waveguide of a stable proton exchange layer is formed in an LiTaO₃ substrate 1, and a plurality of domain inverted layers 3 are periodically arranged along the optical waveguide. By making a fundamental wave P1 incident upon an input end of the optical waveguide, a harmonic wave P2 is emitted from an output end thereof. The length of the optical wavelength conversion element (length of the optical waveguide) is 9 mm in the present example. Moreover, in order to allow for operation at a wavelength of 850 nm, the length of a pitch of the domain inverted layers 3 is set to 3.7 μm.

Hereinafter, referring to FIGS. 8A to 8E, a production method of the optical wavelength conversion element will be described.

Figure 8A:
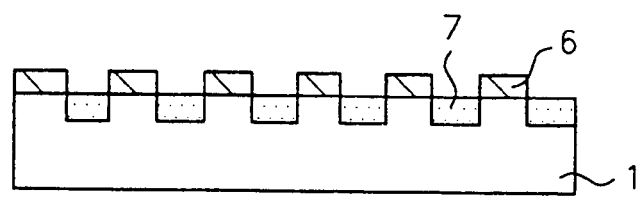
FIGS. 8A, 8B, 8C, 8D and 8E are diagrams illustrating respective steps of a method for producing the optical wavelength conversion element according to Example 1 of the present invention.

First, as shown in FIG. 8A, a Ta film is deposited so as to cover the principal surface of the LiTaO₃ substrate 1, after which ordinary photolithography and dry etching techniques are used to pattern the Ta film (thickness: about 200 to 300 nm) into a striped pattern, thereby forming the Ta mask 6. The Ta mask 6 used in the present example has a pattern where strips each 1.2 μm wide and 10 mm long are arranged so as to be equally spaced apart from one another, and the arrangement pitch of the strips is 3.7 μm. A proton exchange process is performed for the LiTaO₃ substrate 1 whose principal surface is covered by the Ta mask 6. The proton exchange process is performed by immersing the surface of the substrate 1 for 14 minutes in a pyrophosphoric acid heated to 230° C. Thus, 0.5 μm thick proton exchange layers 7 are formed in portions of the LiTaO₃ substrate 1 which are not covered by the Ta mask. Then, the Ta mask is removed by etching for 2 minutes using a mixture containing HF:HNF₃ at 1:1.

Figure 8B:
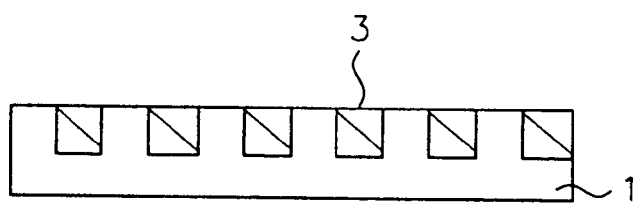

Next, as shown in FIG. 8B, a domain inverted layer is formed in each of the proton exchange layers 7 by performing a heat treatment at a temperature of 550° C. for 15 seconds. In the heat treatment, the temperature rise rate is 50 to 80° C./sec and the cooling rate is 1 to 50° C./sec. In portions of the LiTaO₃ substrate 1 where the proton exchange has been performed, the amount (concentration) of Li is reduced as compared to that in other portions thereof where the proton exchange has not been performed. Therefore, the Curie temperature of the proton exchange layer 7 decreases as compared to that in other portions, whereby the domain inverted layer 3 can be formed partially in the proton exchange layer by a heat treatment at a temperature of 550° C. This heat treatment allows for formation of the domain inverted layers 3 having a periodic pattern reflecting the pattern of the Ta mask 6.

Figure 8C:
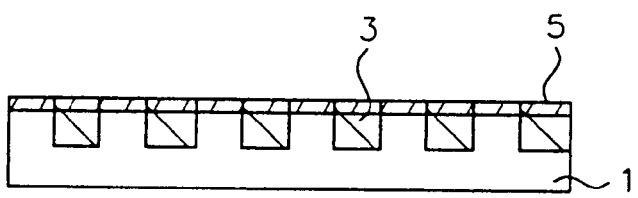

Next, the Ta mask (not shown) used for forming the optical waveguide is formed. The Ta mask is obtained by forming slit-shaped openings (width: 4 μm, length: 12 mm) in a Ta film (thickness: about 200 to 300 nm) deposited on the substrate 1. The openings define the planar layout of the waveguide. It is needless to say that the shape of the waveguide is not limited to the linear shape. The pattern of the Ta mask is determined depending upon the shape of a waveguide to be formed. By performing a proton exchange process at 260° C. for 16 minutes with respect to the LiTaO₃ substrate 1 covered by the Ta mask, a linearly-extending proton exchange layer (thickness: 0.5 μm, width: 5 μm, length 10 mm) 5 is formed in a region of the LiTaO₃ substrate 1 under an opening of the Ta mask, as shown in FIG. 8C. The linearly-extending proton exchange layer 5 will eventually function as a waveguide. Then, the Ta mask is removed by etching for 2 minutes using a mixture containing HF:HNF$_3$ at 1:1.

Figure 8D:
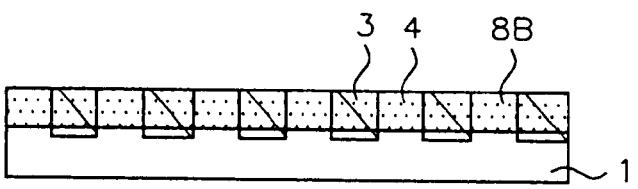

Next, an infrared heating equipment is used to perform annealing at 420° C. for 1 minute. By this annealing, non-linearity of the proton exchange layer 5 is restored, while an altered layer 8b where the refractive index is increased by about 0.03 is formed, as shown in FIG. 8D. As described above, this annealing serves to allow Li and proton to be diffused in the substrate 1 and to reduce the proton exchange concentration of the proton exchange layer 5. Thereafter, a 300 nm thick SiO$_2$ layer (not shown), which functions as a protective layer, is deposited on the principal surface of the substrate 1.

Figure 8E:
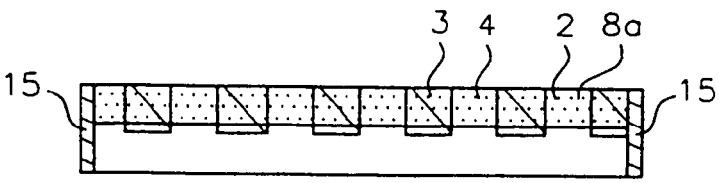

Next, after the surface of the substrate 1 perpendicular to the altered layer 8b is optically polished so as to form an incident portion and an emitting portion of the optical wavelength conversion element, an antireflection (AR) coating 15 is formed on the polished surface of the incident portion and the emitting portion, as shown in FIG. 8E.

Next, low-temperature annealing is performed for preventing temporal variation. In the specification of the present application, "low-temperature annealing" means a heat treatment performed at a temperature which does not substantially reduce the proton concentration in the proton exchange layer. For example, in the case of the LiTaO$_3$ substrate, "low-temperature annealing" means a heat treatment performed at a temperature of about 130° C. or lower. In the present example, a heat treatment is performed at 60° C. for 40 hours under an air atmosphere using an oven. By such low-temperature annealing, a stable proton exchange layer 8a is formed. The stable proton exchange layer 8a forms the optical waveguide.

Figure 9:
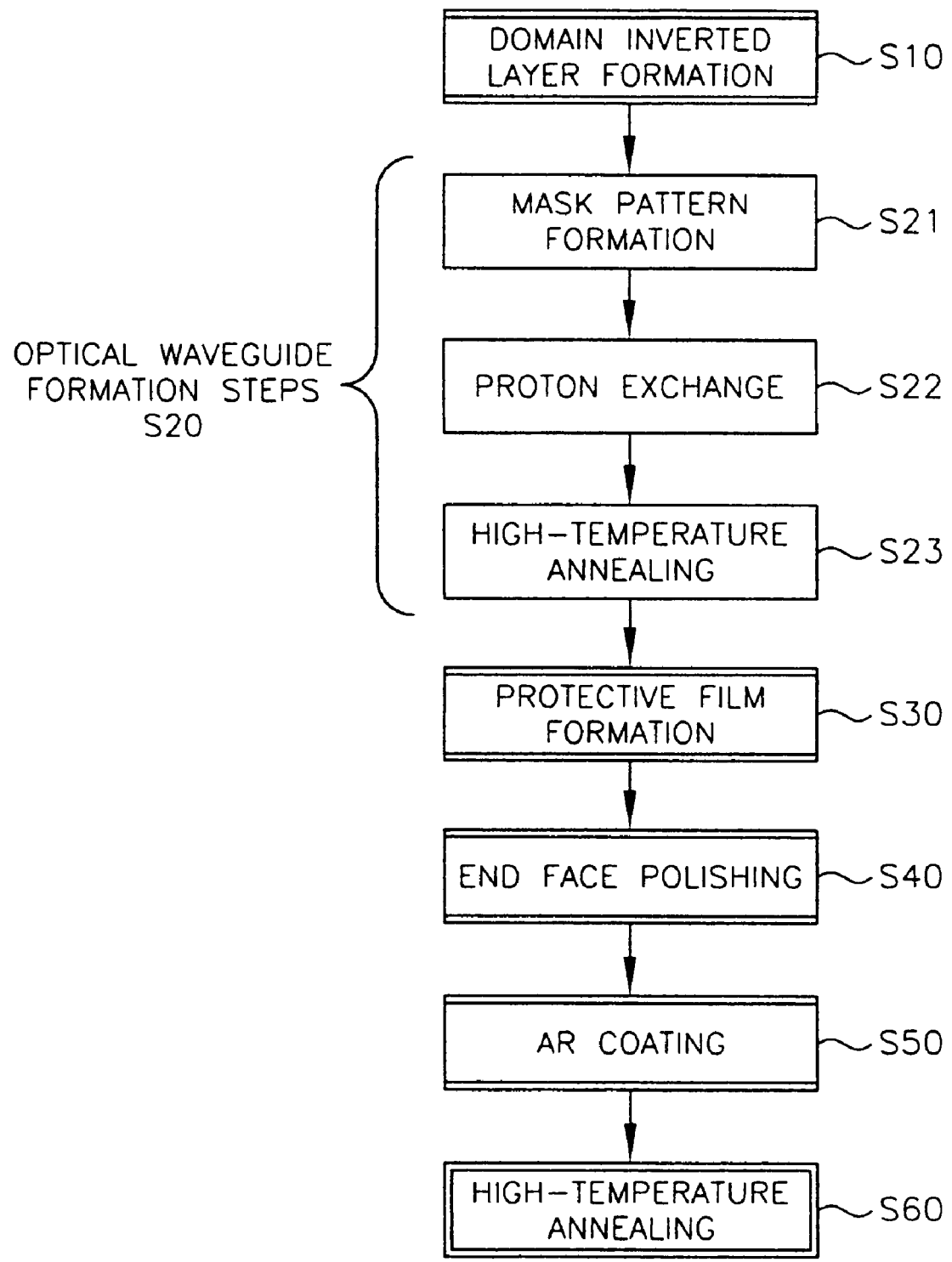
FIG. 9 is a flow chart illustrating steps of a method for producing the optical wavelength conversion element according to Example 1 of the present invention.

Referring to FIG. 9, the flow of the above-described production steps will be described.

After a step of forming the domain inverted layers in the substrate (step S10), an optical waveguide formation step (S20) is performed. The optical waveguide formation step (S20) is generally divided into step S21, step S22 and step S23. The mask pattern is formed at step S21; the proton exchange process is performed at step S22; and high-temperature annealing is performed at step S23. Then, a protective film formation step (step S30), an end face polishing step (step S40), an AR coating step (step S50) are performed. Since the wavelength conversion element, as thus formed, will have some temporal variation, low-temperature annealing is performed at step S60 so as to form a stable proton exchange layer.

Figure 10:
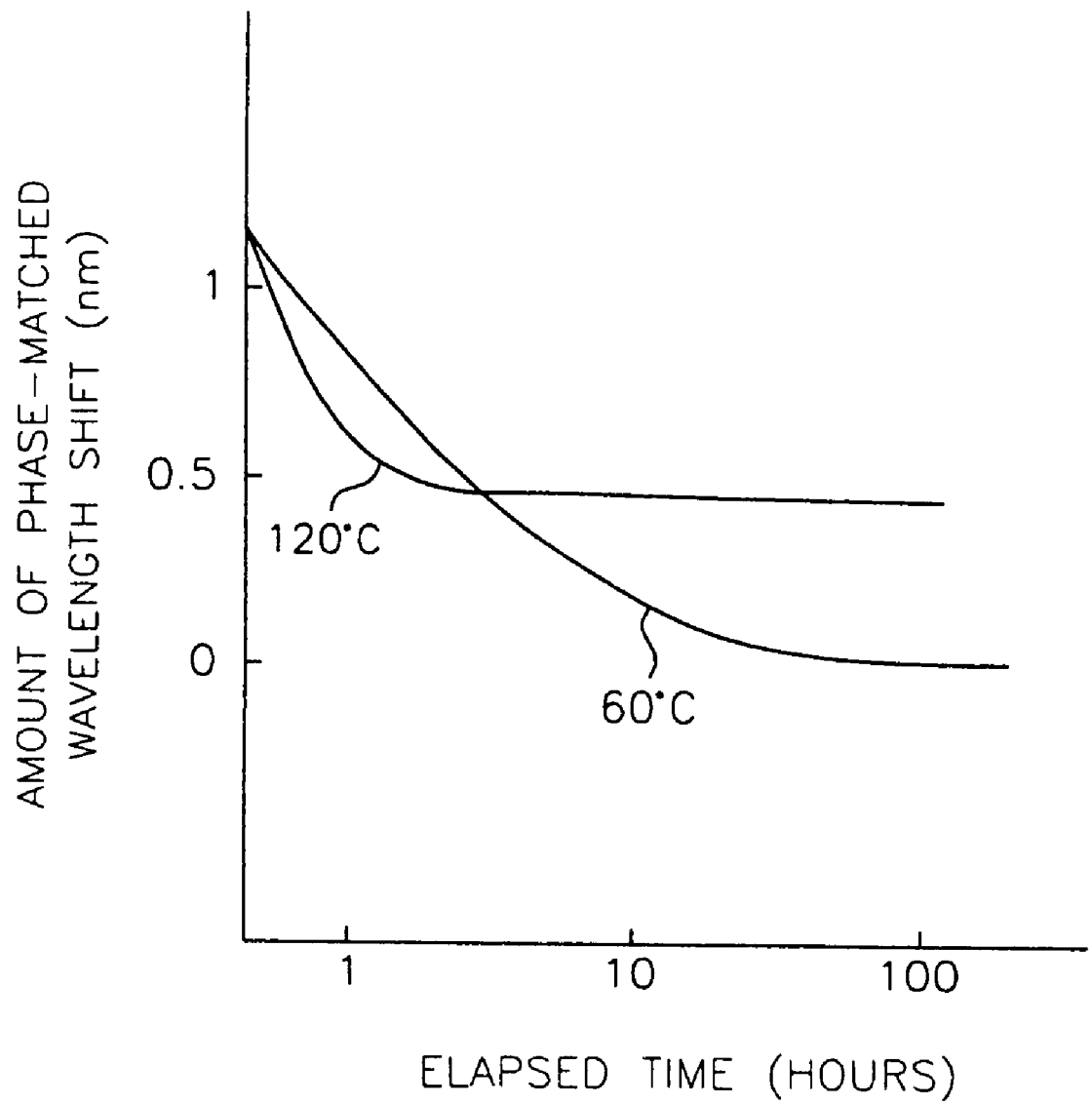
FIG. 10 is a characteristic diagram illustrating phase-matched wavelength variation with respect to the annealing time, with the annealing time being a parameter.

FIG. 10 illustrates the relationship with the annealing time in cases where low-temperature annealing is performed respectively at 60° C. and 120° C. The amount of phase-matched wavelength shift becomes substantially constant after a few hours in the case of annealing at 120° C., but it takes some ten hours to become substantially constant in the case of annealing at 60° C.

It can be seen from FIG. 10 that a steady state is achieved in a shorter annealing time as the temperature of the low-temperature annealing is higher. Moreover, as the annealing temperature is lower, the amount of phase-matched wavelength shift when achieving the steady state indicates a value closer to zero. Thus, if the temperature of the low-temperature annealing is increased, a period of time required for the shift amount to return to zero becomes shorter, but, on the other hand, a relatively great strain will remain.

Figure 11:
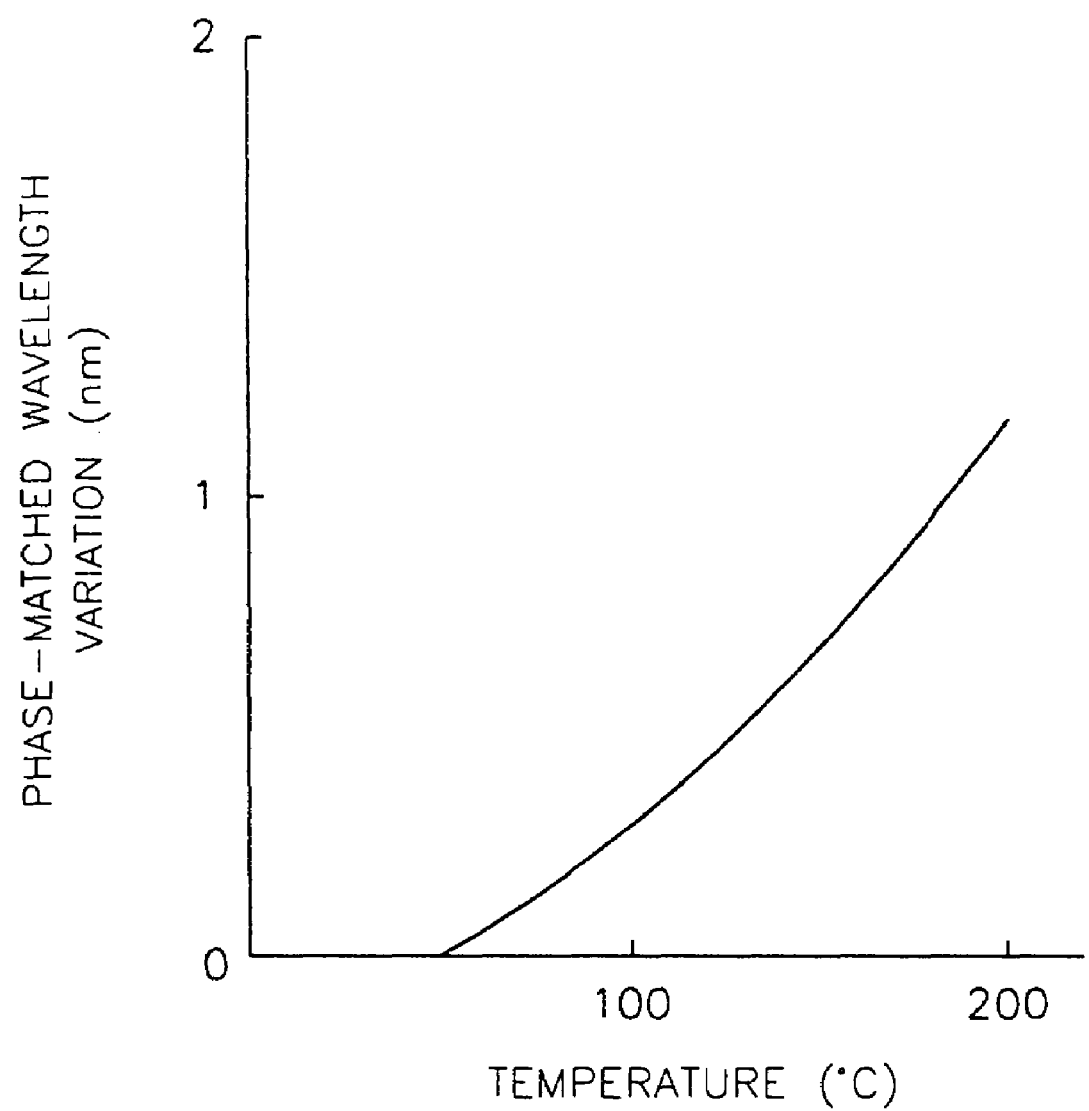
FIG. 11 is a characteristic diagram illustrating the relationship between the annealing temperature and the amount of phase-matched wavelength variation.

FIG. 11 illustrates the relationship between the amount of phase-matched wavelength shift when a steady state is achieved and the temperature of low-temperature annealing. It can be seen from FIG. 11 that the phase-matched wavelength becomes stable in the condition where being shifted by about 0.5 nm when annealing is performed at 120° C. If annealing is performed at 150° C. or higher, the amount of phase-matched wavelength shift after stabilization is 0.8 nm or more. If a phase-matched wavelength shift of such a magnitude remains, long-term use of the optical wavelength conversion element becomes difficult. If the tolerance range of the phase-matched wavelength shift is set to be 0.5 nm or less, the amount of shift cannot be reduced to fall within the tolerance range even if annealing is performed at a temperature exceeding 120° C. When the tolerance range of the phase-matched wavelength shift is extended, the conversion efficiency is reduced. When the amount of the phase-matched wavelength shift exceeds 0.5 nm, only an output about ¼ of that obtainable when the shift amount is zero is obtained. If low-temperature annealing is performed at 60° C., the annealing time is longer, but the shift amount can be reduced to be 0.1 nm or less, whereby the problem of the reduced conversion efficiency is eliminated. It is preferable to suppress the amount of shift in the phase-matched wavelength to be about 0.2 nm or less.

According to the present example, the respective refractive indices of the domain non-inverted layer 4 and the domain inverted layers 3 in the optical waveguide 2 have no temporal variation, and the propagation loss as light is being guided is small. When laser light (wavelength: 850 nm) from a semiconductor laser was made incident upon the incident portion as the fundamental wave P1 so as to propagate through the optical waveguide, the light propagated in a single mode, and the harmonic wave P2 having a wavelength of 425 nm was taken out of the substrate through the emitting portion. The harmonic wave P2 was effectively obtained with a small propagation loss of 1 dB/cm in the optical waveguide 2. For an input of a fundamental wave of 27 mW, a harmonic wave (wavelength: 425 nm) of 1.2 mW was obtained. In this case, the conversion efficiency is 4.5%.

Figure 12:
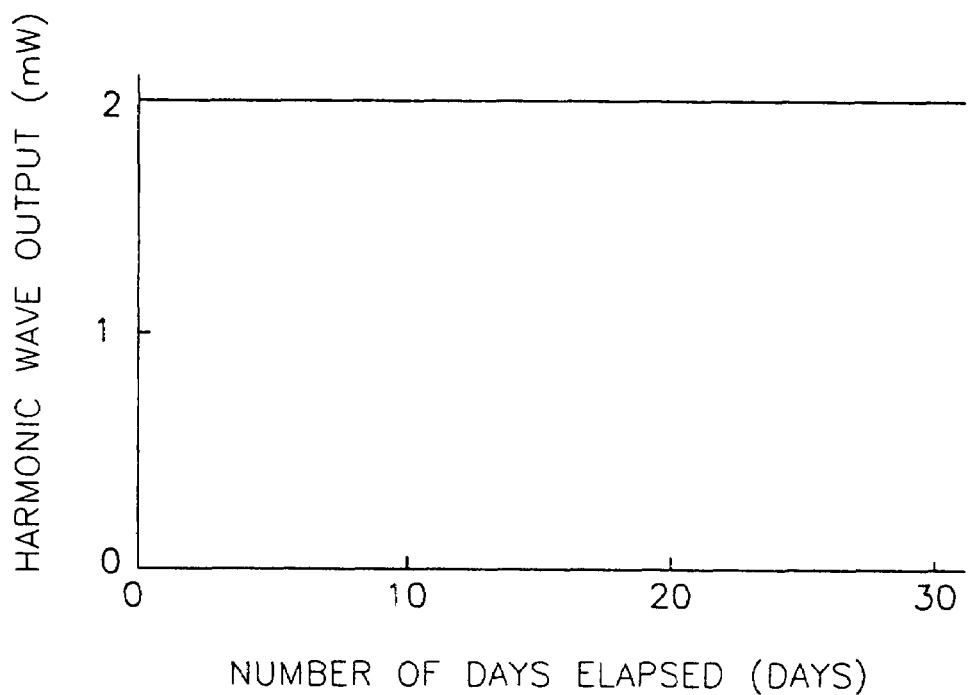
FIG. 12 is a graph illustrating the output-time characteristic of the optical wavelength conversion element according to Example 1 of the present invention.
Figure 13:
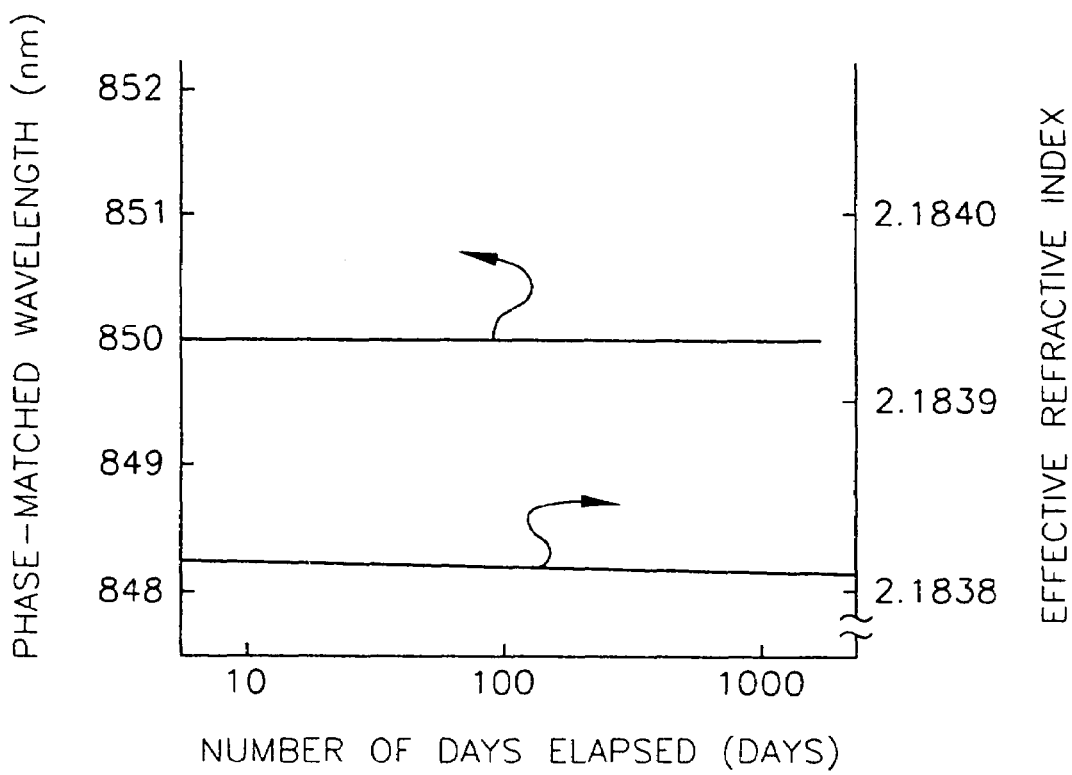
FIG. 13 is a graph illustrating temporal characteristics of the phase-matched wavelength and the effective refractive index of the optical wavelength conversion element according to Example 1 of the present invention.

FIG. 12 illustrates the relationship between the number of days elapsed and the harmonic wave output. FIG. 13 illustrates the relationship between the number of days elapsed and the phase-matched wavelength and, as well as the relationship between the number of days elapsed and the refractive index variation.

It can be seen from these figures that the refractive index variation and the phase-matched wavelength become constant immediately after production of the element. According to the production method of the optical wavelength conversion element of the present invention, it was possible to realize an optical wavelength conversion element which has no refractive index variation with the passage of time and which thus has a constant phase-matched wavelength. By combining this element with a semiconductor laser, it is possible to produce a stable short wavelength laser. At a temperature of about 60° C., low-temperature annealing for 40 hours or more is particularly effective.

EXAMPLE 2

Next, Example 2 of the present invention will be described.

First, a Ta film is deposited so as to cover the principal surface of the LiTaO$_3$ substrate, after which ordinary photolithography and dry etching techniques are used to pattern the Ta film (thickness: about 200 to 300 nm) into a striped pattern, thereby forming the Ta mask. The Ta mask used in the present example has a pattern where strips each 1.2 μm wide and 10 mm long are arranged so as to be equally spaced apart from one another, and the arrangement pitch of the strips is 3.6 μm. A proton exchange process is performed for the LiTaO$_3$ substrate 1 whose principal surface is covered by the Ta mask. The proton exchange process is performed by immersing the surface of the substrate for 20 minutes in a pyrophosphoric acid heated to 260° C. Thus, 0.5 μm thick proton exchange layers are formed in portions of the LiTaO$_3$ substrate 1 which are not covered by the Ta mask. Then, the Ta mask is removed by etching for 2 minutes using a mixture containing HF:HNF$_3$ at 1:1.

Next, a domain inverted layer is formed in each of the proton exchange layers 7 by performing a heat treatment at a temperature of 550° C. for 15 seconds. In the heat treatment, the temperature rise rate is 50° C./sec and the cooling rate is 10° C./sec. This heat treatment allows for formation of the domain inverted layers having a periodic pattern reflecting the periodic pattern of the Ta mask.

Figure 14:
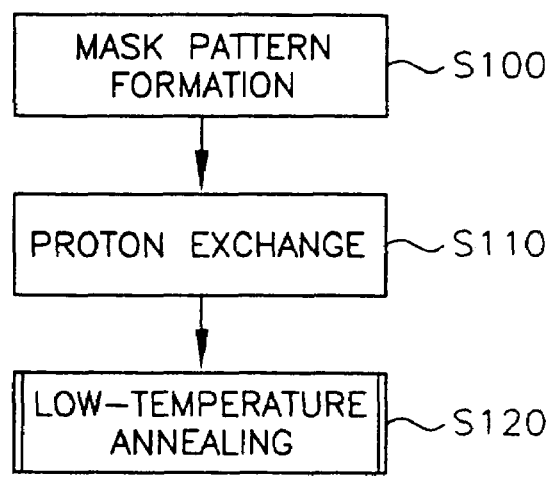
FIG. 14 is a flow chart illustrating steps of a method for producing an optical wavelength conversion element according to Example 2 of the present invention.

Referring to FIG. 14, the flow of the steps following the above-described steps will be described.

First, a proton exchange process is performed for the surface of the substrate on which the domain inverted layers are arranged so as to form an optical waveguide (step S100). A Ta film, in which slits each 4 μm wide and 12 mm long are formed, is used as a mask for forming the optical waveguide.

Next, proton exchange is performed at 260° C. for 16 minutes in a pyrophosphoric acid (step S110), after which the Ta mask is removed. After covering the principal surface of the substrate with an SiO$_2$ film having a thickness of 300 nm, low-temperature annealing (step S120) is performed so as to complete the formation of the optical waveguide. For the low-temperature annealing, a heat treatment in air at 120° C. was performed for 200 hours in order to prevent the refractive index from increasing. By this low-temperature annealing, a stable proton exchange layer is formed.

Through the above-described steps, the domain inverted layers and the optical waveguide are formed in the substrate. When the thickness of the domain inverted layer is set to 2.2 μm, in order to effectively perform wavelength conversion, the thickness d of the optical waveguide is set to be thinner than the thickness of the domain inverted layer, e.g., 1.8 μm. In order to allow for operation at a wavelength of 840 nm, the pitch of the domain inverted layers is set to 3.6 μm.

According to the above-described production method, the respective refractive indices of the domain non-inverted layer and the domain inverted layers have no temporal variation, and the propagation loss of light is small. The surface perpendicular to the optical waveguide was optically polished so as to form an incident portion and an emitting portion. Thus, an optical wavelength conversion element can be produced. Moreover, the length of the element is 9 mm.

When semiconductor laser light (wavelength: 840 nm) as the fundamental wave P1 was made incident upon the incident portion of the waveguide, the harmonic wave P2 having a wavelength of 420 nm was taken out of the substrate through the emitting portion. A harmonic wave (wavelength: 420 nm) having an output of 10 mW was obtained for an input of a fundamental wave having an output of 80 mW. In this case, the conversion efficiency is 12%. The harmonic wave output was very stable with no optical damage or no temporal variation. When a high-temperature annealing step is not performed in the course of the process, as in this example, the temporal variation can be prevented.

EXAMPLE 3

Next, as Example 3 of the present invention, a case of using an LiNbO$_3$ substrate (thickness: 0.4 to 0.5 mm) will be described.

First, ordinary photolithography and dry etching techniques are used to form a Ta electrode (first Ta electrode) having a pattern similar to the pattern of the Ta mask used in the above-described examples on the principal surface of the LiNbO$_3$ substrate.

Then, a Ta film (second Ta electrode) is deposited on the entire reverse surface of the substrate. The first Ta electrode formed on the principal surface of the substrate and the second Ta electrode formed on the reverse surface of the substrate form an electrode structure for applying an electric field across the substrate.

Next, a voltage (e.g., 10 kilovolts) is applied between the first Ta electrode and the second Ta electrode so as to form an electric field in the LiNbO$_3$ substrate. By the application of an electric field, a domain inverted layer is formed so as to extend from a portion of the surface of the substrate being in contact with the first Ta electrode to the reverse surface of the substrate.

Next, etching is performed for 2 minutes using a mixture containing HF:HNF$_3$ at 1:1 so as to remove the Ta electrode. Then, a Ta mask having slit-shaped openings (width: 4 μm, length: 12 mm) is formed on the substrate, after which a proton exchange process (230° C., 10 minutes) using a pyrophosphoric acid is performed so as to form an optical waveguide. After removing the Ta mask, annealing at 420° C. for 2 minutes is performed using infrared heating equipment. By this annealing, non-linearity in the optical waveguide is restored, but an altered layer is formed where the refractive index is increased by about 0.02.

Then, a 300 nm thick SiO$_2$ film, which functions as a protective film, is deposited on the substrate. Next, in order to mitigate the strain which causes the refractive index to increase, annealing in air at 100° C. for 20 hours (first stage low-temperature annealing) is performed, which is followed by annealing at 60° C. for 10 hours (second stage low-temperature annealing). Thus, two stages of low-temperature annealing are performed in the present example. The low-temperature annealing is performed in separate two stages in order to reduce the total amount of time required for the low-temperature annealing. By annealing at 100° C., the strain is mitigated more quickly than in annealing at 60° C., but some strain remains which corresponds to the amount of the phase-matched wavelength shift at 100° C. as shown in FIG. 11. Therefore, low-temperature annealing at 60° C. is additionally performed so as to completely eliminate the strain. This 2-stage annealing makes it possible to quickly and completely form the "stable proton exchange layer" which is unlikely to generate strain.

The thickness d of the optical waveguide formed by the steps as described above is 1.8 μm. The arrangement pitch of the domain inverted layers is 3 μm, and it operates at a wavelength of 840 nm. The surface perpendicular to the optical waveguide is optically polished so as to form the incident portion and the emitting portion. Thus, the optical wavelength conversion element can be produced. Moreover, the length of the element is 10 mm. When semiconductor laser light (wavelength: 840 nm) as the fundamental wave P1 was guided from the incident portion, the harmonic wave P2 having a wavelength of 420 nm was taken out of the substrate through the emitting portion. A harmonic wave (wavelength: 420 nm) of 13 mW was obtained for an input of a fundamental wave of 80 mW. The harmonic wave output was very stable with no temporal variation.

Although two different low-temperature annealings at different temperatures (2-stage annealing) were performed in this example, it is also applicable to perform low-temperature annealing where the temperature is gradually lowered, for example, from 100° C. to 60° C. in 30 hours.

EXAMPLE 4

Next, referring to FIGS. 15A to 15C, Example 4 of the present invention will be described.

Figure 15A:
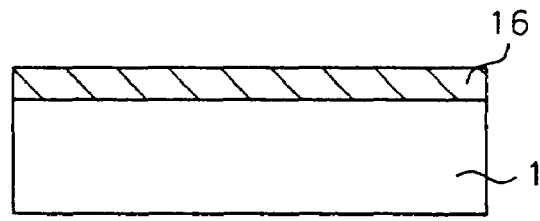
FIGS. 15A, 15B and 15C are diagrams illustrating respective steps of a method for producing an optical element according to Example 4 of the present invention.
Figure 15B:
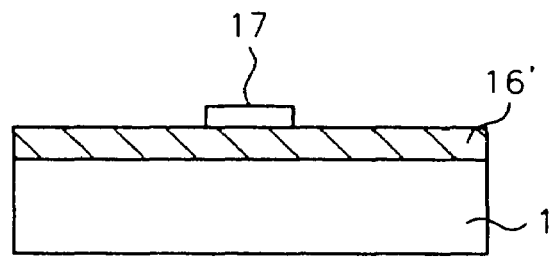
Figure 15C:
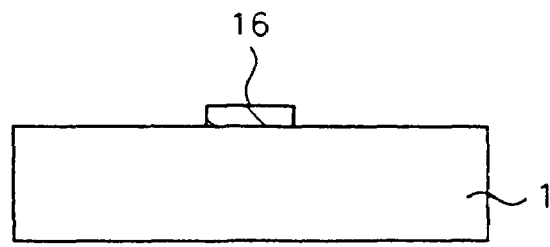

First, as shown in FIG. 15A, a mixture film ($LiNb_{0.5}Ta_{0.5}O_3$ film) 16' of $LiNbO_3$ and $LiTaO_3$ is grown on the $LiTaO_3$ substrate 1 by a liquid phase epitaxial growth method. At this point of time, the growth temperature exceeds 1000° C., and some strain remains at the interface between the mixture film 16 and the $LiTaO_3$ substrate 1. Next, as shown in FIG. 15B, a resist mask 17 is formed on the mixture film 16' using an ordinary photolithography technique. Next, as shown in FIG. 15C, a portion of the mixture film 16 which is not covered with the resist mask 17 is removed by ion beam etching so as to leave the optical waveguide 16 having a width of, for example, 4 μm.

After a 300 nm thick $SiO_2$ is deposited on the substrate 1 by a vapor deposition method, low-temperature annealing is performed in order to mitigate an increase in the refractive index. This annealing includes a first stage low-temperature annealing performed at 100° C. for 30 hours and a subsequent low-temperature annealing performed at 70° C. for 60 hours. By this low-temperature annealing, a stable optical waveguide 16 with no refractive index variation is obtained.

The thickness d of the optical waveguide formed by the above-described steps is 1.8 μm. Moreover, the length of the element is 9 mm. The surface perpendicular to the optical waveguide was optically polished so as to form the incident portion and the emitting portion. When semiconductor laser light (wavelength: 840 nm) was guided from the incident portion, the waveguide loss was very small. It was very stable with the temporal variation of the refractive index being less than the measuring limit. The material of the mixture film is not limited to $LiNb_{0.5}Ta_{0.5}O_3$, but may also be $LiNb_xTa_{1-x}O_3$ (0<x<1) or any other optical material.

EXAMPLE 5

Next, Example 5 of the present invention will be described.

Figure 16:
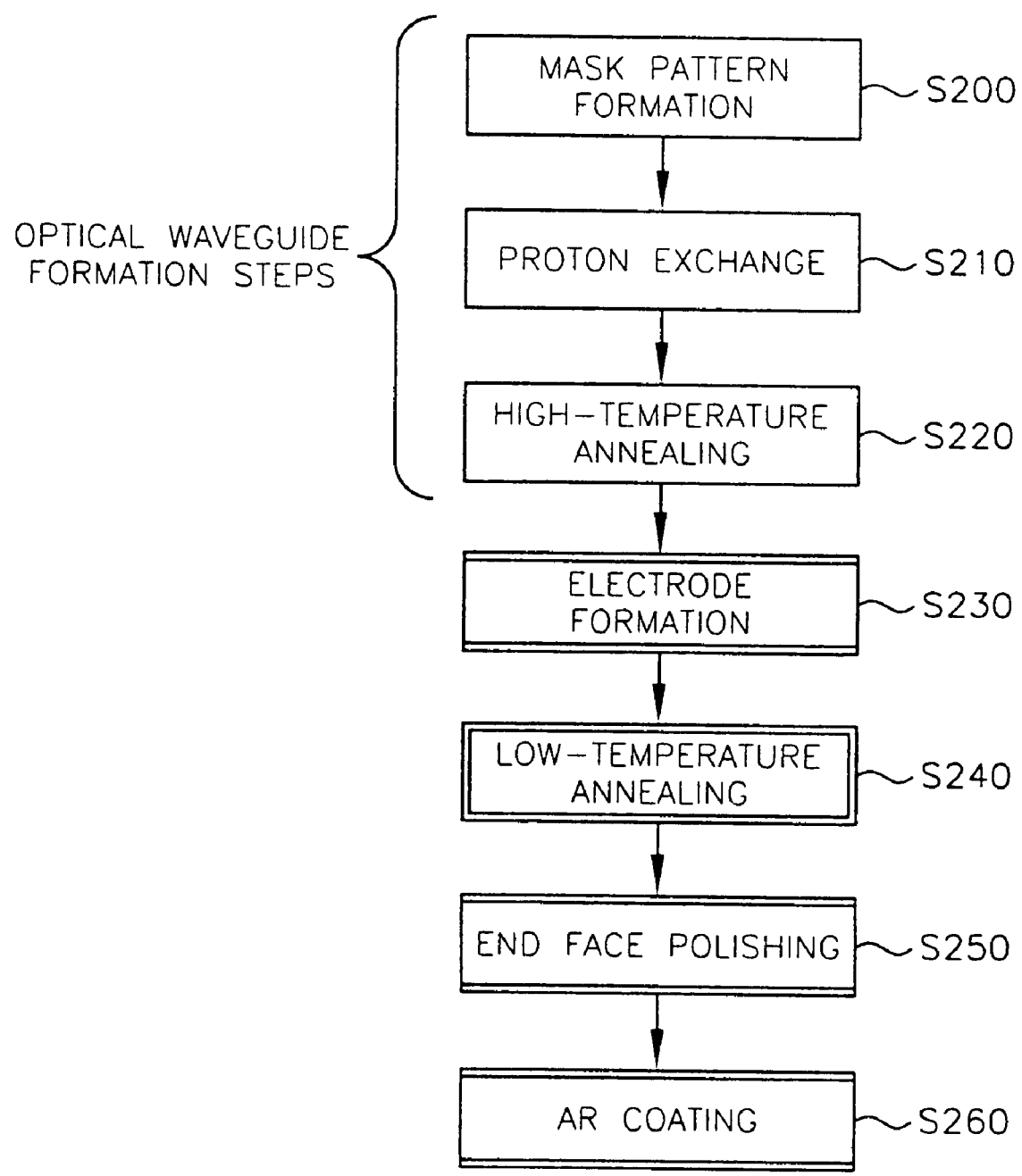
FIG. 16 is a flow chart illustrating steps of a method for producing an optical element according to Example 5 of the present invention.

Referring to FIG. 16, the outline of the process flow of the present example will be described.

First, an optical waveguide formation step is performed. The optical waveguide formation step is generally divided into step S200, step S210 and step S220. The mask pattern is formed at step S200; the proton exchange process is performed at step S210; and high-temperature annealing is performed at step S220. Then, an electrode formation step (step S230), a low-temperature annealing step (step S240), an end face polishing step (step S250) and an AR coating step (step S260) are performed.

Hereinafter, details of the process will be described.

First, ordinary photo process and dry etching are used to pattern Ta into slits. Next, proton exchange is performed at 30° C. for 10 minutes for the $LiTaO_3$ substrate 1, on which the pattern of Ta has been formed, so as to form a 0.5 μm thick proton exchange layer directly under the slit. Next, Ta is removed by etching for 2 minutes using a mixture containing $HF:HNF_3$ at 1:1. A diffusion furnace is used to perform annealing (first annealing) at 400° C. for 1 hour, and an altered layer is formed where the refractive index is increased by about 0.01. Next, as the electrode formation step, 300 nm of $SiO_2$ was added by vapor deposition. After Al was deposited into a striped shape as an electrode mask, patterning was performed. Next, low-temperature annealing was performed in order to mitigate an increase in refractive index. Annealing was performed in air at 70° C. for 10 hours. Thus, a stable proton exchange layer is formed. Herein, the second annealing was performed at a temperature lower than that in the first annealing by 330° C. Lowering it by 200° C. or more is effective because the strain can be greatly mitigated thereby. Finally, polishing and AR coating were performed.

By the steps as described above, an optical waveguide with an electrode was produced. This functions as an optical modulator. The thickness of the optical waveguide is 8 μm. The surface perpendicular to the optical waveguide was optically polished so as to form the incident portion and the emitting portion. Thus, an optical element can be produced. Moreover, the length of the element is 9 mm. When a modulation signal is applied to the electrode so as to guide semiconductor laser light (wavelength: 1.56 μm) as a fundamental wave from the incident portion, modulated light was taken out through the emitting portion. There was no temporal variation, and the bias voltage remained stable for more than 2000 hours.

Although the present invention has been described in respect of an optical wavelength conversion element and an optical modulator as an example of an optical element in the above-described examples, the present invention is not limited thereto, but may also be applied to a flat device such as a Fresnel lens or a hologram. Temporal variation in refractive index associated with the proton exchange process can be prevented while deterioration of characteristics can be suppressed.

EXAMPLE 6

Next, referring to FIG. 17, Example 6 of the present invention will be described. The present example is a short wavelength light source including a semiconductor laser and an optical wavelength conversion element.

Figure 17:
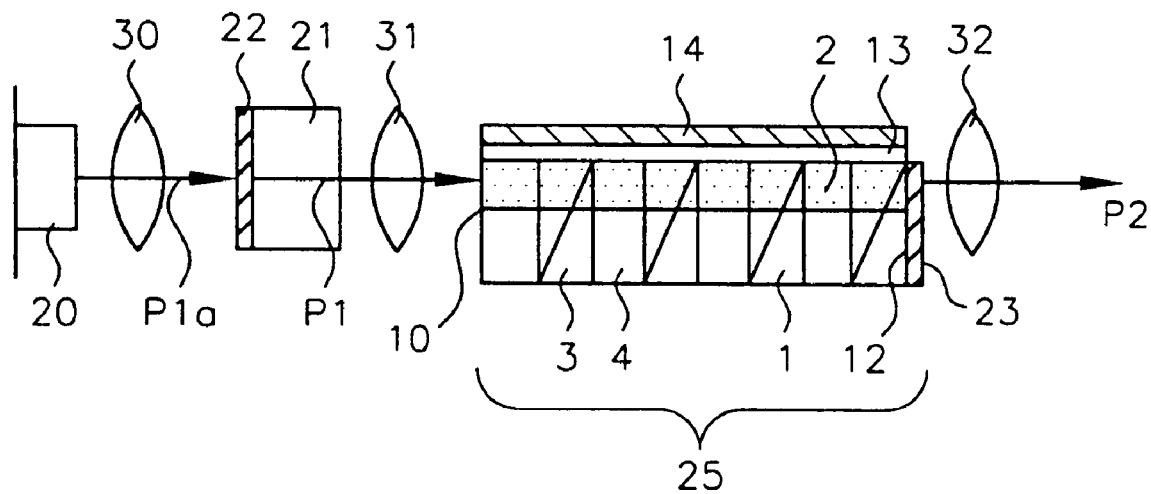
FIG. 17 is a diagram illustrating a configuration of an example of a laser light source according to the present invention.

As shown in FIG. 17, the pumped light P1a emitted from the semiconductor laser 20 is collected by the lens 30 so as to excite the YAG 21 as a solid-state laser crystal.

The total reflection mirror 22 for 947 nm is formed on the YAG 21, whereby laser oscillation occurs at a wavelength of 947 nm so as to radiate the fundamental wave P1. On the other hand, the total reflection mirror 23 for the fundamental wave P1 is formed on the emitting side of the optical wavelength conversion element 25, whereby laser oscillation occurs therebetween. The fundamental wave P1 is collected by a lens 31, and the fundamental wave P1 is converted to the harmonic wave P2 by the optical wavelength conversion element 25. In this example, the optical waveguide 2 produced in the $LiTaO_3$ substrate 1 by utilizing proton exchange is used as an optical wavelength conversion element having periodic domain inverted structures where a periodic structure is formed.

In FIG. 17, reference numeral 1 denotes an $LiTaO_3$ substrate of a Z plate; 2 denotes a formed optical waveguide; 3 denotes a domain inverted layer; 10 denotes an incident portion for the fundamental wave P1; and 12 denotes an emitting portion for the harmonic wave P2. The fundamental wave P1 which has entered the optical waveguide 2 is converted to the harmonic wave P2 by the domain inverted layer 3 which has a length of the phase-matched length L, and the harmonic wave power is then increased by the domain non-inverted layer 4 which also has the length of L.

In this manner, the harmonic wave P2 whose power has been increased in the optical waveguide 2 is radiated from the emitting portion 12. The radiated harmonic wave P2 is collimated by the a lens 32.

Moreover, an electrode 14 is formed in the optical wavelength conversion element 25 via a protective film 13. Next, the production method of the optical wavelength conversion element 25 will be briefly described referring to the figures.

Figure 18A:
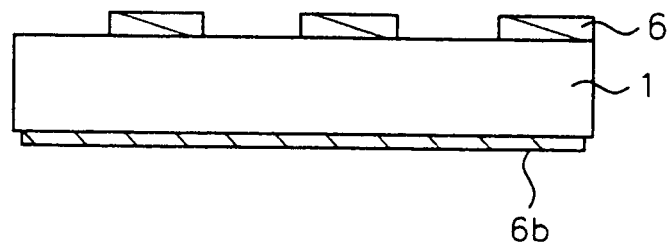
FIGS. 18A, 18B, 18C and 18D are diagrams illustrating respective production steps of the optical wavelength conversion element in the laser light source of the present invention.

First, as shown in FIG. 18A, ordinary photolithography and dry etching techniques are used to form a Ta electrode (first Ta electrode) 6 having a pattern similar to the pattern of the Ta mask used in the above-described respective examples on the principal surface of the 0.3 mm thick LiNbO$_3$ substrate 1.

Then, a Ta film (second Ta electrode) 6b is deposited on the entire reverse surface of the substrate 1. The first Ta electrode 6 formed on the principal surface of the substrate 1 and the second Ta electrode 6b formed on the reverse surface of the substrate 1 form an electrode structure for applying an electric field across the substrate 1.

Figure 18B:
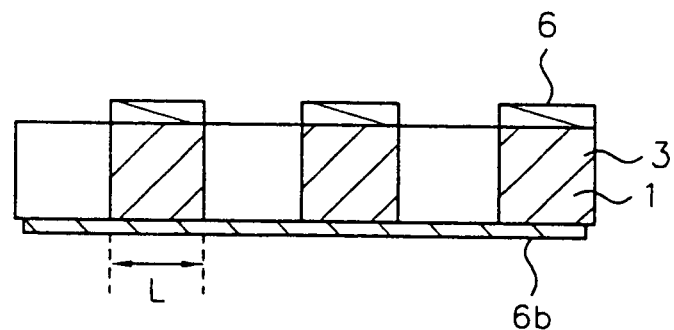

Next, a voltage (e.g., 10 kilovolts) is applied between the first Ta electrode 6 and the second Ta electrode 6b so as to form an electric field in the LiNbO$_3$ substrate 1. By the application of an electric field, a domain inverted layer 3 is formed so as to extend from a portion of the surface of the substrate 1 in contact with the first Ta electrode 6 to the reverse surface of the substrate 1, as shown in FIG. 18B. The length L of the domain inverted layer 3 along the direction in which light propagates is 2.5 µm. Then, etching is performed for 20 minutes using a mixture containing HF:HNF$_3$ at 1:1 so as to remove the Ta electrodes 6 and 6b.

Figure 18C:
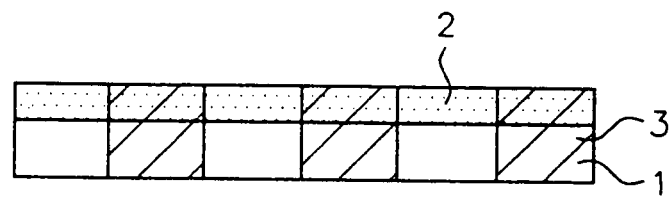

Then, a Ta mask (not shown) having slit-shaped openings (width: 4 µm, length: 12 mm) is formed on the substrate 1, after which a proton exchange process (260° C., 40 minutes) using a pyrophosphoric acid is performed so as to form the optical waveguide 2, as shown in FIG. 18C. The Ta mask has slits (width: 6 µm, length: 10 mm), and the slits define the planar layout of the optical waveguide 2. After removing the Ta mask, annealing for 5 hours at 460° C. is performed using infrared heating equipment. By this annealing, the optical waveguide for which proton exchange has been performed restores its non-linearity, and the refractive index at the portion increases by about 0.002. Light propagates along the optical waveguide 2 having a high refractive index. The thickness d of the optical waveguide 2 is 50 µm, and the width thereof is 70 µm. The arrangement pitch of the domain inverted layers 3 along the direction in which the waveguide 2 extends is 5 µm, and the optical wavelength conversion element operates for a fundamental wave having a wavelength of 947 nm.

Figure 18D:
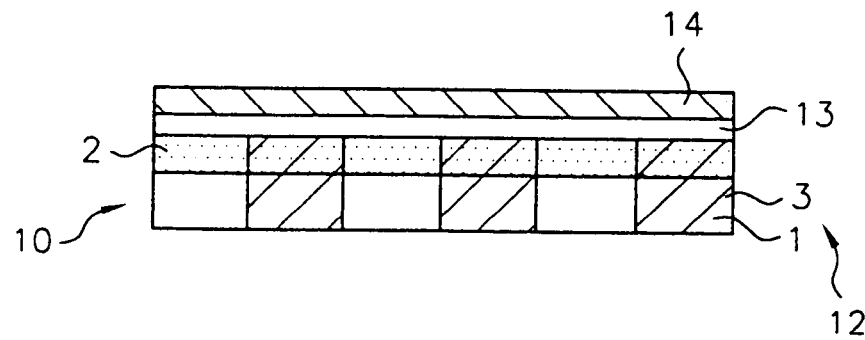

Next, as shown in FIG. 18D, after a protective film (thickness: 300 to 400 nm) 13 made of SiO$_2$ is formed on the substrate 1, an Al film (thickness: 200 nm) is formed on the protective layer 13 by vapor deposition. The Al film is patterned by photolithography technique so as to form the Al electrode 14. The Al electrode 14 is used for modulating the intensity of output light.

The surface perpendicular to the direction in which the optical waveguide 2 extends is optically polished so as to form the incident portion 10 and the emitting portion 12 as shown in FIG. 17. Moreover, an antireflection coating for the fundamental wave P1 is applied onto the incident portion 10. A reflective coating (99%) for the fundamental wave P1 and an antireflection coating for the harmonic wave P2 are applied onto the emitting portion 12.

In this way, the optical wavelength conversion element 25 (element length: 10 mm) as shown in FIG. 17 can be produced.

In FIG. 17, when light having a wavelength of 947 nm as the fundamental wave P1 was guided from the incident portion 10, it propagated in a single mode, and the harmonic wave P2 having a wavelength of 473 nm was taken out of the substrate through the emitting portion 12. The propagation loss in the optical waveguide 2 was as small as 0.1 dB/cm, thus improving the performance of the cavity, increasing the power concentration of the fundamental wave P1, and generating the harmonic wave P2 at a high efficiency.

Possible causes for the reduced loss may include that a uniform optical waveguide was formed by the phosphoric acid and that the confinement in the waveguide was reduced. Moreover, due to the optical waveguide with the weak confinement, the harmonic wave concentration was reduced, and the optical damage was considerably improved. This is because, an area 100 times larger with respect to that in a conventional technique can tolerate a 100 times greater optical damage.

Figure 19:
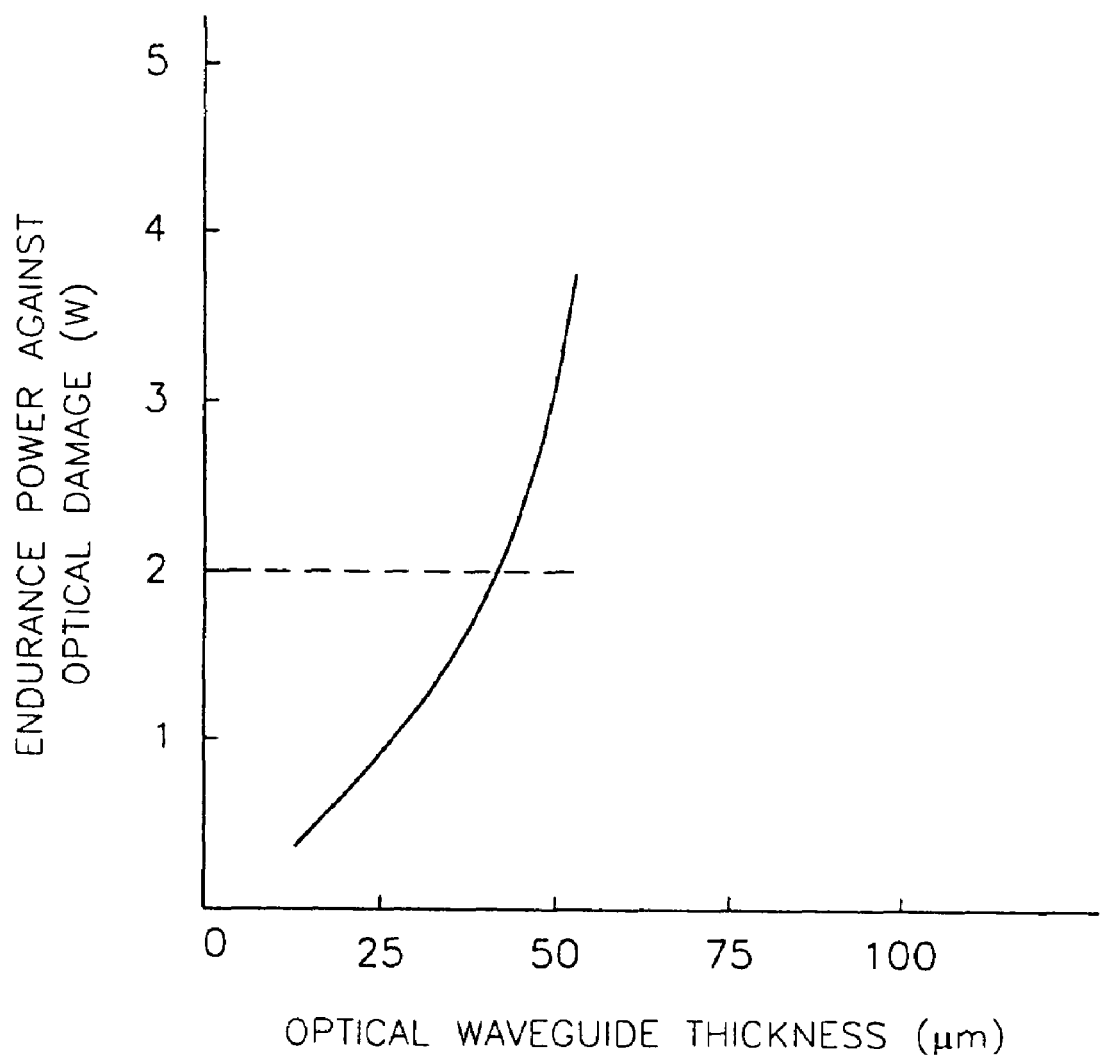
FIG. 19 is a graph illustrating the relationship between the optical waveguide thickness and the endurance property against optical damage of the optical wavelength conversion element used in the laser light source of the present invention.

FIG. 19 illustrates the relationship between the optical waveguide thickness and the endurance power against optical damage. The endurance power against optical damage is a power that indicates the highest blue harmonic wave which can be tolerated, i.e., the highest blue harmonic wave for which optical variation does not occur. It can be seen that, when the thickness of the optical waveguide is widened, the width thereof is also simultaneously widened due to diffusion, whereby the endurance power against optical damage is improved in relation to the optical waveguide thickness being substantially squared. Since the power required for laser radiation is at least 2 W, it is preferable that the optical waveguide thickness is 40 µm or greater.

Moreover, if the cross-section of the waveguide is enlarged in the case where the refractive index distribution in and in the vicinity of the waveguide varies in a stepped manner, a multi-mode propagation phenomenon occurs. In order to avoid this, a waveguide having a graded type refractive index distribution is formed in the present example.

When the output of the output light P1a from the semiconductor laser 20 was 10 W, a harmonic wave P3 having an output of 3 W was obtained. In this case, the conversion efficiency is 30%. The tolerance range of the optical wavelength conversion element against the wavelength variation is 0.4 nm. Even if the wavelength is shifted by 0.4 nm, the oscillation wavelength of the solid state laser was constant, while the harmonic wave output was stable. By applying a voltage to the Al electrode 14 for modulation, the refractive index varies in and in the vicinity of the waveguide, thereby shifting the phase-matched wavelength of the optical wavelength conversion element. By utilizing the phenomenon that the phase-matched wavelength is greatly shifted by a voltage application, it is possible to modulate the harmonic wave output with application of a relatively low voltage of about 100 V.

Thus, with the optical wavelength conversion element using the periodic domain inverted structures used in the present example, it is possible to easily modulate the harmonic wave output by applying a voltage, and a voltage required to be applied is thus low, providing high industrial applicability.

Thus, a modulator can be integrated, whereby it is possible to achieve smaller size, lighter weight and lower cost. Moreover, there is another feature that LiTaO$_3$, which is a non-linear optical crystal used in the present invention, can be obtained in a large crystal, whereby it is easy to mass produce the optical wavelength conversion element using an optical IC process. Multi-mode propagation for a fundamental wave results in an unstable harmonic wave output and is thus unpractical, whereas a single mode is effective. It is highly desirable to use an element having periodic domain inverted structures as the optical wavelength conversion element, as in this example, since this makes it possible to improve efficiency and realize integration of the optical modulator, as well as allowing red and green laser light in addition to blue laser light to be taken out by varying the pitch. The optical modulator may also be separated.

Figure 20:
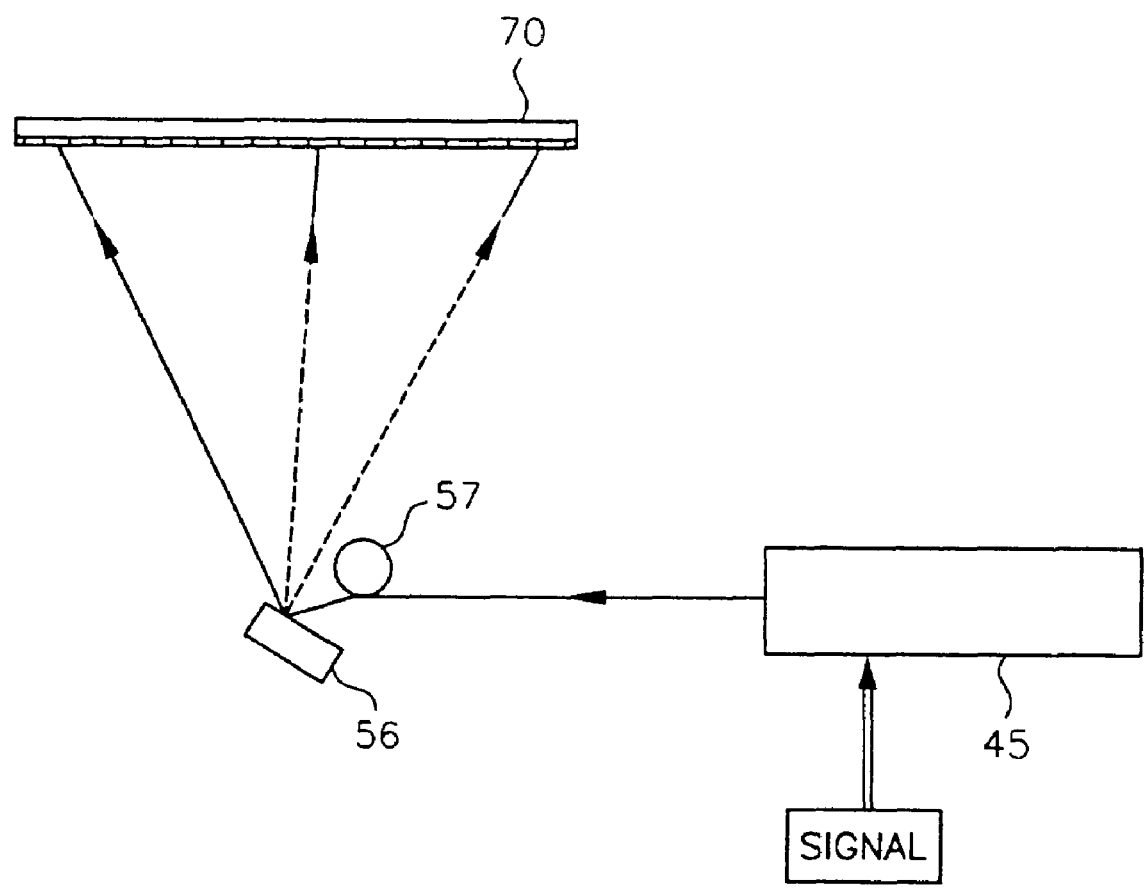
FIG. 20 is a diagram illustrating a configuration of a laser device according to an example of the present invention.

Next, referring to FIG. 20, an example of a laser projection apparatus of the present invention will be described. As shown in FIG. 20, the blue laser light source shown in FIG. 17 was used as the light source for this laser projection apparatus. Reference numeral 45 denotes a laser light source having a wavelength in the 473 nm band which is blue color. The blue light is modulated by inputting a modulation signal to a modulation electrode. The blue laser light which has been modulated is incident upon a deflector. Reference numeral 56 denotes a vertical deflector, and 57 denotes a horizontal deflector, for both of which a rotating polygon mirror is used. A brightness of 300 cd/m$^2$, a contrast ratio of 100:1 and a horizontal resolution of 1000 TV were obtained for a screen size of 4 m×3 m using a screen 70 having a gain of 3. Thus, the resolution was considerably improved as compared to that in a conventional technique. As compared to a configuration using a gas laser, other considerable improvements were also achieved such as a one-thousandth weight, a one-thousandth volume and a one-hundredth power consumption. The small size and the low power consumption of the laser light source and the integration of the optical modulator greatly contribute to these achievements. That is, this results from that the configuration using a semiconductor laser and an optical wavelength conversion element can be subminiaturized, and that the efficiency of conversion from an electrical power is higher than that of a gas laser by about two orders of magnitude. Particularly, it is significantly effective to use an element having periodic domain inverted structures as an optical wavelength conversion element, whereby efficiency can be improved while the optical modulator can be integrated. Although the screen is irradiated with laser light from the reverse side thereof in the present example, it is also applicable to radiate it from the front side thereof.

Next, referring to FIG. 21, another example of a laser light source of the present invention will be described.

Figure 21:
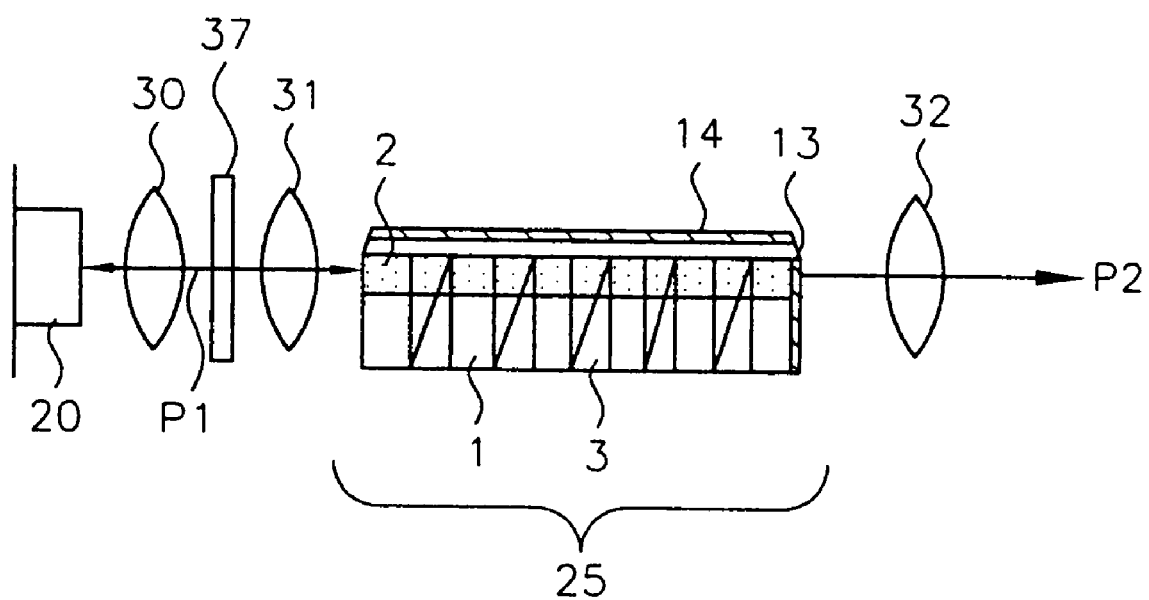
FIG. 21 is a diagram illustrating a configuration of a laser light source according to an example of the present invention.

As shown in FIG. 21, the fundamental wave P1 emitted from the semiconductor laser 20 is guided to the optical wavelength conversion element 25 via the lens 30, a half-wave plate 37 and a collective lens 31, and is converted to the harmonic wave P2. That is, in this example, blue light is obtained without using a solid state laser. The structure of the optical wavelength conversion element 25 is substantially the same as that in Example 1. The present example also uses an LiTaO$_3$ substrate and an optical wavelength conversion element of the optical waveguide type. Moreover, for performing optical modulation, the electrode 14 and the protective film 13 are formed. However, the present example does not employ the cavity structure.

Figure 22:
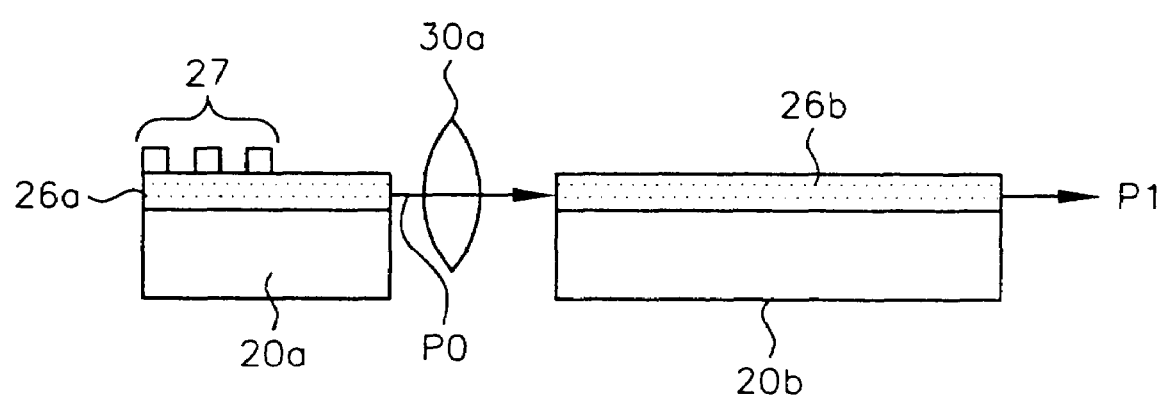
FIG. 22 is a diagram illustrating a configuration of a semiconductor laser used for a laser light source according to an example of the present invention.

FIG. 22 illustrates an internal structure of the semiconductor laser 20. The semiconductor laser 20 is composed of a distributed feedback type (hereinafter, abbreviated as DBR) semiconductor laser 20a and a semiconductor laser amplifier 20b. The DBR semiconductor laser 20a is provided with a DBR section 27 using a grating, and thus stably oscillates at a constant wavelength. A stabilized fundamental wave P0 emitted from the DBR semiconductor laser 20a is guided to the semiconductor laser amplifier 20b by a lens 30a. The power is amplified by an active layer 26b of the semiconductor laser amplifier 20b so as to provide a stable fundamental wave P1. By incorporating this into the optical wavelength conversion element 25, the conversion efficiency and the harmonic wave output are considerably improved. The pitch of domain inversion is 3 μm, and the optical waveguide length is 7 mm. In this example, the oscillation wavelength of the semiconductor laser was 960 nm, the wavelength of the generated harmonic wave P2 was 480 nm, and the color was blue. The conversion efficiency is 10% for an input of 10 W. There was no optical damage, and the harmonic wave output was very stable. A DBR semiconductor laser has a stable oscillation wavelength and is favorable in stabilizing the harmonic wave output.

Next, an RF superimposition (radio frequency superimposition) was performed for this DBR semiconductor laser. A pulse train was optically output from the semiconductor laser by applying a sine-shaped electric waveform of 800 MHz to the DBR semiconductor and utilizing the relaxation oscillation. When the RF superimposition is thus performed for the DBR semiconductor laser, the peak output of the fundamental wave is considerably improved while keeping the oscillation wavelength constant. For a fundamental wave with an average output of 10 W, a harmonic wave of 5 W was obtained with a conversion efficiency of 50%. The conversion efficiency was improved by 5-fold as compared to the case when the RF superimposition is not performed.

Although the DBR semiconductor laser and the semiconductor laser amplifier were separated from each other in the present example, further miniaturization can be achieved if they are integrated.

Figure 23:
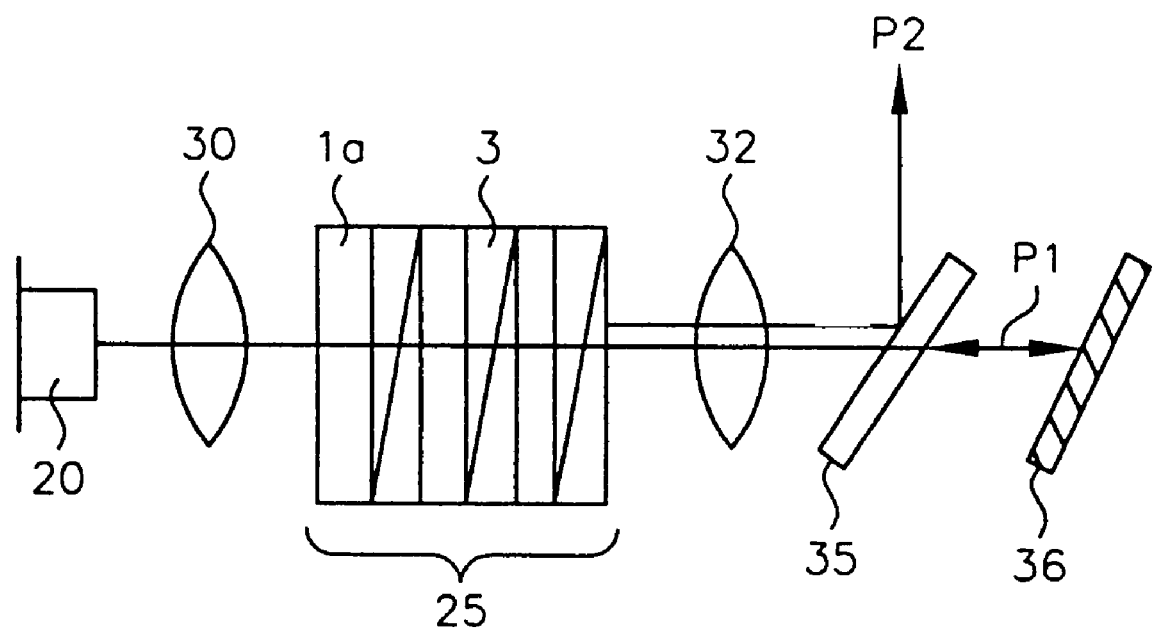
FIG. 23 is a diagram illustrating a configuration of a laser light source according to an example of the present invention.

Next, referring to FIG. 23, still another example of the laser light source of the present invention will be described. The fundamental wave P1 from the semiconductor laser 20 is gently collected to the optical wavelength conversion element 25 by the lens 30. In the present example, LiNbO$_3$ was used as a substrate in place of the LiTaO$_3$ substrate. Moreover, the bulk type optical wavelength conversion element 25 is used. The LiNbO$_3$ substrate 1a has a feature of large non-linearity. The peak power is improved by the RF driving of the semiconductor laser 20, whereby the conversion efficiency of the optical wavelength conversion element is considerably improved. The pitch of the domain inverted layers 3 is 3.5 μm, and the length of the optical wavelength conversion element 25 is 7 mm. In this example, the output of the harmonic wave P2 is stabilized by using the optical feedback method. The wavelength tolerance range of the optical wavelength conversion element 25 is as narrow as about 0.1 nm. The fundamental wave P1 which has not been converted by the optical wavelength conversion element 25 is collimated by the lens 32 and is reflected by a grating 36 so as to return to the semiconductor laser 20. Thus, the oscillation wavelength of the semiconductor laser 20 is locked at the reflection wavelength of the grating 36. In order to adjust the oscillation wavelength to the phase-matched wavelength of the optical wavelength conversion element 25, the angle of the grating 36 can be varied.

On the other hand, the harmonic wave P2 is reflected by a dichroic mirror 35 so as to be taken out in a different direction. In this example, the oscillation wavelength of the semiconductor laser was 980 nm, and the harmonic wave P2 taken out was blue light at 490 nm. At this time, an electric waveform having an RF frequency of 810 MHz and an output of 5 W was applied. Moreover, a harmonic wave of 3 W was obtained for an average output of the fundamental wave being 15 W. There was no optical damage and the harmonic wave output was very stable. The optical damage is not present because the fundamental wave is collected only to about 100 μm, and the harmonic wave is accordingly not so large in terms of concentration.

Although a wavelength is locked by optical feedback using a grating in the present example, the present invention is not limited thereto, but it is also applicable, for example, to achieve optical feedback by using a filter to select a wavelength. Moreover, if a laser projection apparatus is formed using the laser light source of the present example, it is possible to achieve smaller size, lighter weight and lower cost. Furthermore, according to the present example, a harmonic wave can also be modulated by directly modulating the semiconductor laser, whereby the configuration becomes simple, and it is possible to reduce the cost.

Figure 24:
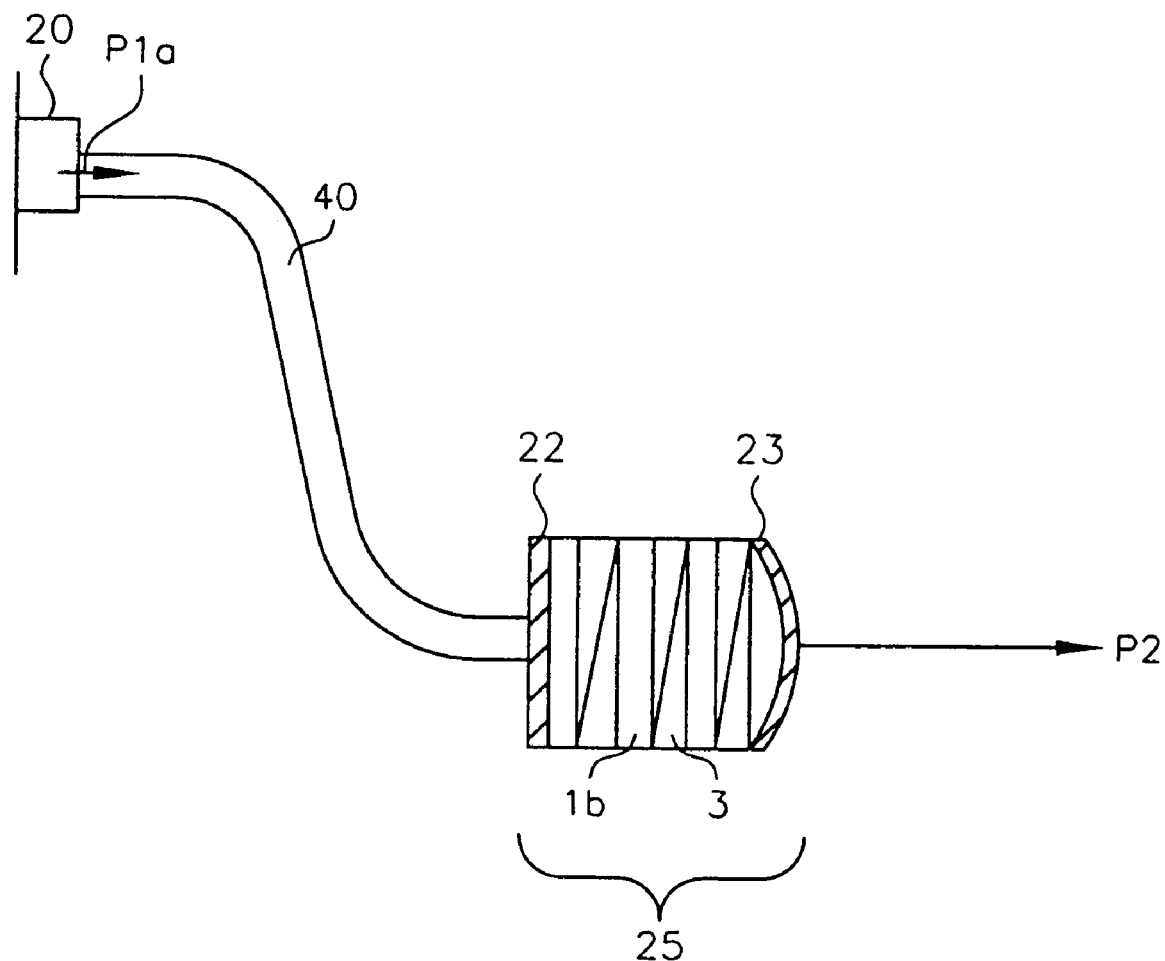
FIG. 24 is a diagram illustrating a configuration of a laser light source according to an example of the present invention.

Next, referring to FIG. 24, another example of a laser light source of the present invention will be described. The cross section of the optical wavelength conversion element (bulk type) 25 is shown in FIG. 24.

The pumped light P1$a$ emitted from the semiconductor laser 20 having a wavelength of 806 nm is incident upon a fiber 40 and propagates through the fiber 40. The pumped light P1$a$ emitted from the fiber 40 enters the optical wavelength conversion element 25. The material of the optical wavelength conversion element 25 is an $LiTaO_3$ substrate 1$b$ into which Nd, being a rare earth element, is doped, and the domain inverted structures are formed with a pitch of 5.1 μm. The doping amount of Nd is 1 mol %. Reference numeral 22 denotes a total reflection mirror which totally reflects 99% of light having a wavelength of 947 nm but transmits light in the 800 nm band. Reference numeral 23 also denotes a total reflection mirror but which totally reflects 99% of light having a wavelength of 947 nm and transmits light in the 470 nm band. Moreover, the total reflection mirror section is processed to be a spherical shape. That is, it serves as a spherical mirror. The optical wavelength conversion element 25 oscillates at a wavelength of 947 nm as excited by the semiconductor laser 20, and the light is converted to the harmonic wave P2 by the domain inverted structures of the domain inverted layers 3 so as to be emitted out. A harmonic wave of 2 W was obtained for the pumped light P1 of 20 W. Moreover, temperature stabilization is provided by a Peltier element so that the temperature of the optical wavelength conversion element does not vary considerably. The conversion section of the laser light source according to this example has a length of 10 mm, and it can be made very compact by doping a rare earth element into the optical wavelength conversion element and designing it so that the pumped light propagates through a fiber. Moreover, it is possible to prevent temperature variation by remotely disposing the optical wavelength conversion element away from the heat generated by the semiconductor laser.

Figure 25:
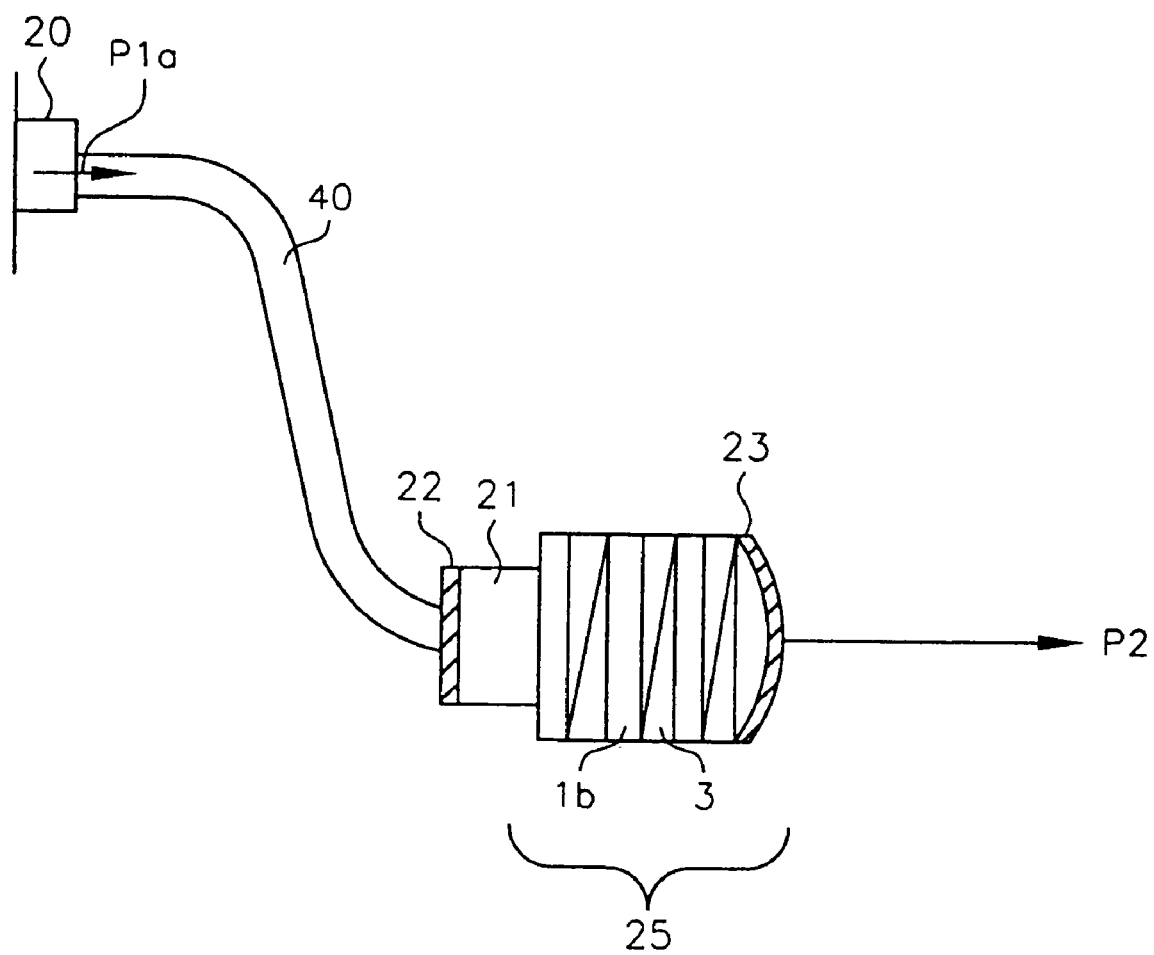
FIG. 25 is a diagram illustrating a configuration of a laser light source of a separate type according to an example of the present invention.

Furthermore, by changing the coating on the total reflection mirrors 22 and 23 for reflection of the 1060 nm band, and changing the pitch of the domain inverted layers 3 for 1060 nm, oscillation was achieved at 1060 nm, whereby green laser light (wavelength: 530 nm) was obtained as the harmonic wave P2. Moreover, by changing the coating on the total reflection mirrors 22 and 23 for reflection of the 1300 nm band, and changing the pitch of the domain inverted layers 3 for 1300 nm, oscillation was achieved at 1300 nm, whereby red laser light (wavelength: 650 nm) was obtained as the harmonic wave P2. With this configuration, primary color laser light, i.e., blue, green and red light, can be easily obtained. Next, FIG. 25 illustrates another configuration where the solid state laser crystal and the optical wavelength conversion element are separated from each other. $Nd:YVO_4$ as the solid state laser crystal 21 was attached to the output side of the fiber. The domain inverted structures are periodically formed in the optical wavelength conversion element 25 of the $LiTaO_3$ substrate 1. Blue laser light of 2 W was stably obtained also by the laser light source of this configuration.

Figure 26:
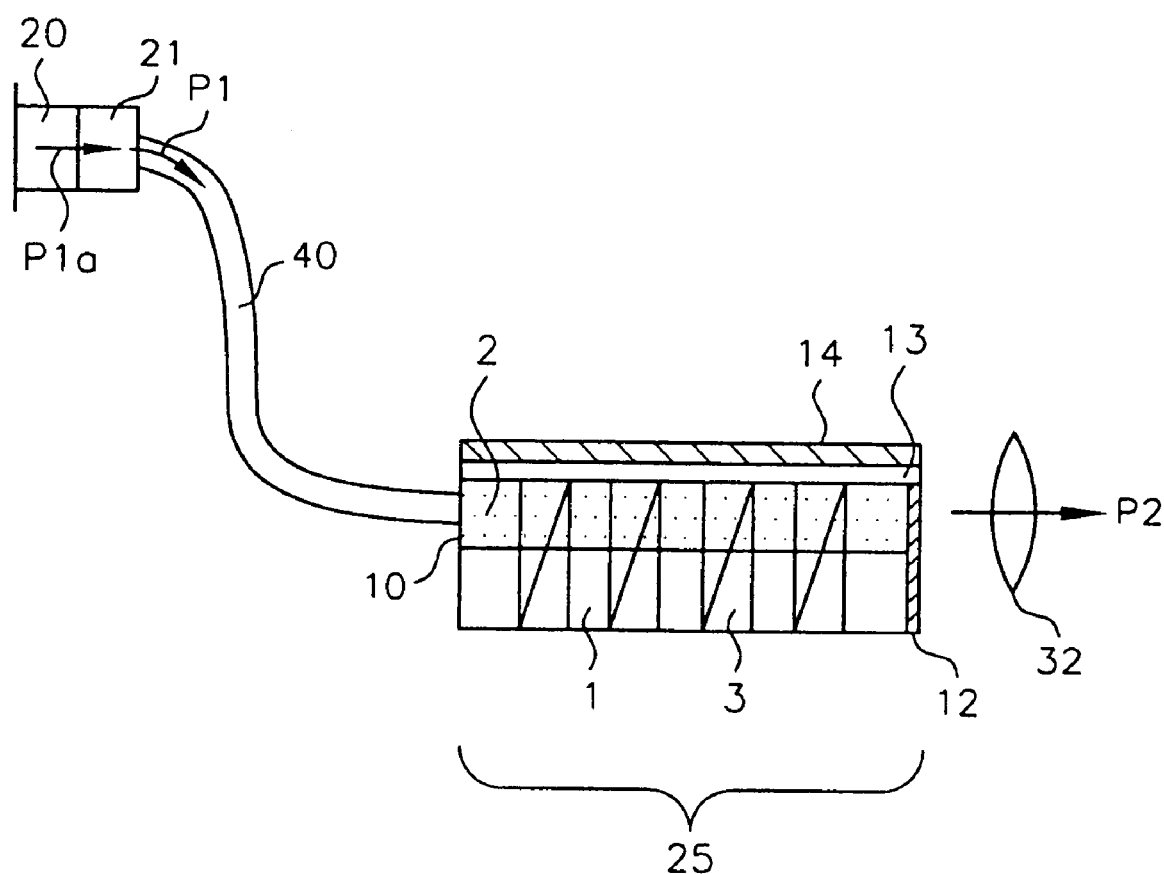
FIG. 26 is a diagram illustrating a configuration of a laser light source according to an example of the present invention.

Still another example of the present invention will be described referring to the figures. FIG. 26 illustrates a configuration of a laser light source according to the present example. The pumped light P1$a$ emitted from the semiconductor laser 20 having a wavelength of 806 nm is converted to the fundamental wave P1 by the solid state laser crystal 21, is incident upon the fiber 40, and propagates through the fiber 40. The fiber 40 is a single mode fiber. The fundamental wave P1 emitted from the fiber 40 enters the optical wavelength conversion element 25. In this example, the optical waveguide 2 which is produced in the $LiTaO_3$ substrate 1 utilizing proton exchange is used as the optical wavelength conversion element 25 with periodic domain inverted structures. In the figure, reference numeral 1 denotes an $LiTaO_3$ substrate of a Z plate; 2 denotes a formed optical waveguide; 3 denotes a domain inverted layer; 10 denotes an incident portion for the fundamental wave P1; and 12 denotes an emitting portion for the harmonic wave P2. The fundamental wave P1 which has entered the optical waveguide 2 is converted to the harmonic wave P2 by the domain inverted layers 3. Thus, the harmonic wave P2 having the power increased in the optical waveguide 2 is radiated out through the emitting portion 12. The radiated harmonic wave P2 is collimated by the lens 32.

Moreover, the electrode 14 is formed on the element via the protective film 13. The harmonic wave P2 of 10 W was obtained for the pumped light P1$a$ of 30 W. The blue laser light was modulated at 30 MHz by applying a modulation signal to the electrode 14 formed on the optical wavelength conversion element 25. The conversion section of the laser light source according to this example has a length of 10 mm, and it can be made very compact by designing it so that the fundamental wave P1 propagates through a fiber. Moreover, it is possible to prevent temperature variation by remotely disposing the optical wavelength conversion element away from the semiconductor laser.

FIG. 26 illustrates an example where a solid state laser crystal is not used.

A semiconductor laser of 980 nm, having an output of 10 W, is used. This is coupled to the optical wavelength conversion element 25 through the fiber 40 so as to perform direct conversion. An output of 2 W was obtained for a wavelength of 490 nm.

Figure 27:
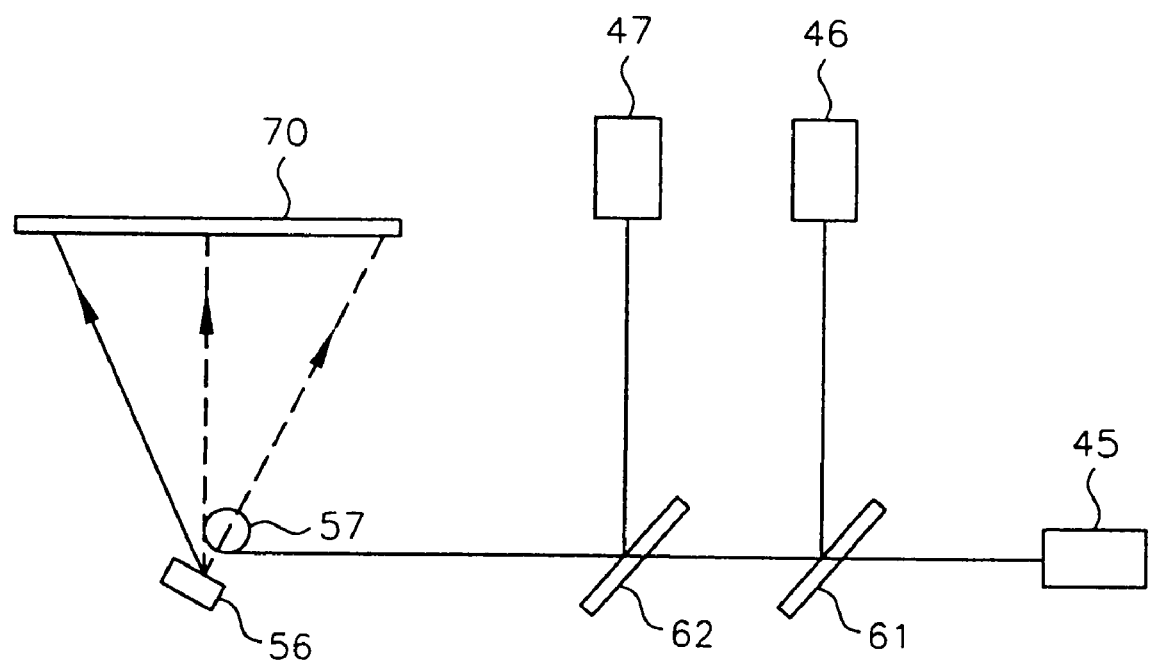
FIG. 27 is a diagram illustrating a configuration of a laser device according to an example of the present invention.

Next, referring to FIG. 27, a laser projection apparatus of the present invention will be described. Light sources of three colors, i.e., the blue laser light source, the green laser light source and the red laser light source of Example 5 were used as light sources. Reference numeral 45 denotes a blue laser light source in the 473 nm wavelength band. Reference numeral 46 denotes a green laser light source in the 530 nm wavelength band; and 47 denotes a red laser light source in the 650 nm wavelength band. A modulation electrode is attached to each of the optical wavelength conversion elements. Each light source output is modulated by inputting a modulation signal to the modulation electrode. The green laser light is combined with the blue laser light by the a dichroic mirror 61. Moreover, the red laser light is combined with the other two colors by a dichroic mirror 62. Reference numeral 56 denotes a vertical deflector, and 57 denotes a horizontal deflector, both of which use a rotating polygon mirror. A brightness of 2000 cd/m$^2$, a contrast ratio of 100:1, a horizontal resolution of 1000 TV and a vertical resolution of 1000 TV were obtained for a screen size of 2 m×1 m using a screen 70 having a gain of 3. Thus, the laser projection apparatus of the present invention is significantly effective in providing a high brightness, a high resolution and an extremely low power consumption.

Although an optical wavelength conversion element of the domain inverted type is used in the present example, it is not limited thereto. Moreover, when a laser light source which is directly oscillated by a semiconductor laser is used for red color, the cost can be further reduced. Alternatively, the semiconductor laser direct oscillation type may be used as the blue or green laser. The combination thereof may be freely determined.

Moreover, in the present example, the following features have been devised for safety. The laser is designed to turn off automatically when the laser light scanning is terminated. Infrared laser light being sub-semiconductor laser with a weak output is scanning around the projected laser light, and it is designed so that the laser light is automatically turned off when an object contacts the light. An infrared semiconductor laser has a feature of a low cost and a long life.

Figure 28:
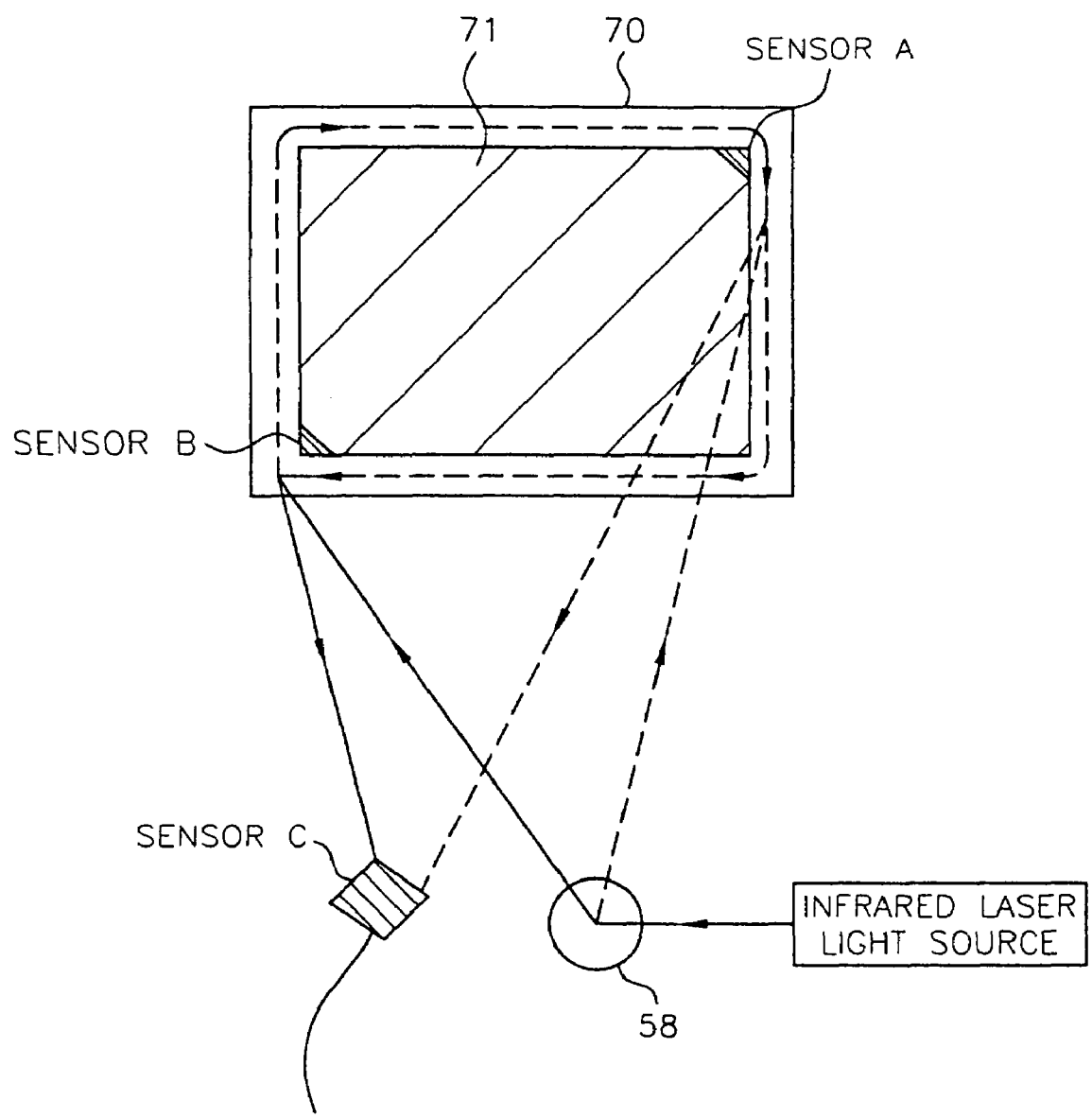
FIG. 28 is a diagram illustrating a configuration of an automatic shutdown device for a laser device according to an example of the present invention.

Next, these will be described referring to FIG. 28. The three laser light beams of the primary colors are scanned by the deflector within a display area 71 of the screen 70. The laser light passes over sensors A and B located on the periphery of the display area 71. Output signals from the sensors A and B are always being monitored. On the other hand, the laser light from the infrared laser light source of an infrared semiconductor laser is always scanned by a deflector 58 along the periphery of the screen 70. The reflected light enters a sensor C. That is, it is designed so that light reflected at any position along the periphery enters the sensor C.

Figure 29:
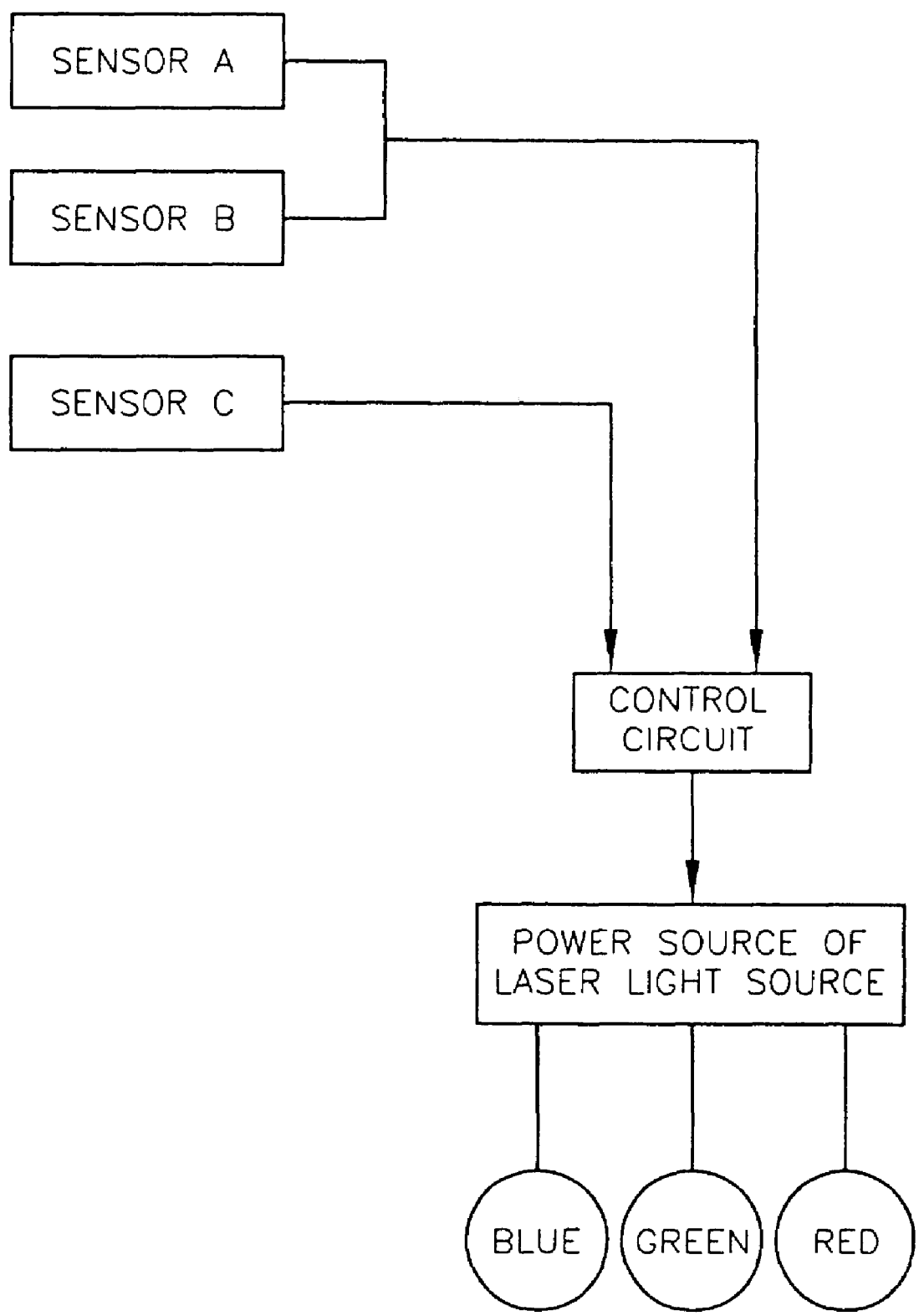
FIG. 29 is a diagram illustrating a control system for the automatic shutdown device for a laser device according to an example of the present invention.

Next, control will be described referring to FIG. 29. In FIG. 29, when a signal from either one of the sensors A and B does not enter a control circuit for a certain period of time, the main power of the laser light source is turned off so that the blue, red and green laser light sources are turned off. That is, by terminating the scanning, it is possible to prevent a certain position from being irradiated with the laser light in a concentrated manner. Moreover, if the signal from the sensor C is discontinued even for a moment, the power of the laser light source is turned off by the control circuit. Thus, it is safe since a human, etc., never touches the short wavelength laser light having a high output. The safety of this laser projection apparatus is maintained as described above.

Although the power of the laser light source is turned off in the example, it is also applicable to block the optical path of the laser. Moreover, generation of short wavelength laser light may be terminated by shifting the phase-matched wavelength of the optical wavelength conversion element using a voltage or the like, or by varying the oscillation wavelength of the semiconductor laser as a fundamental wave light source. This method allows for considerable reduction of the period of time required for a restart.

Figure 30:
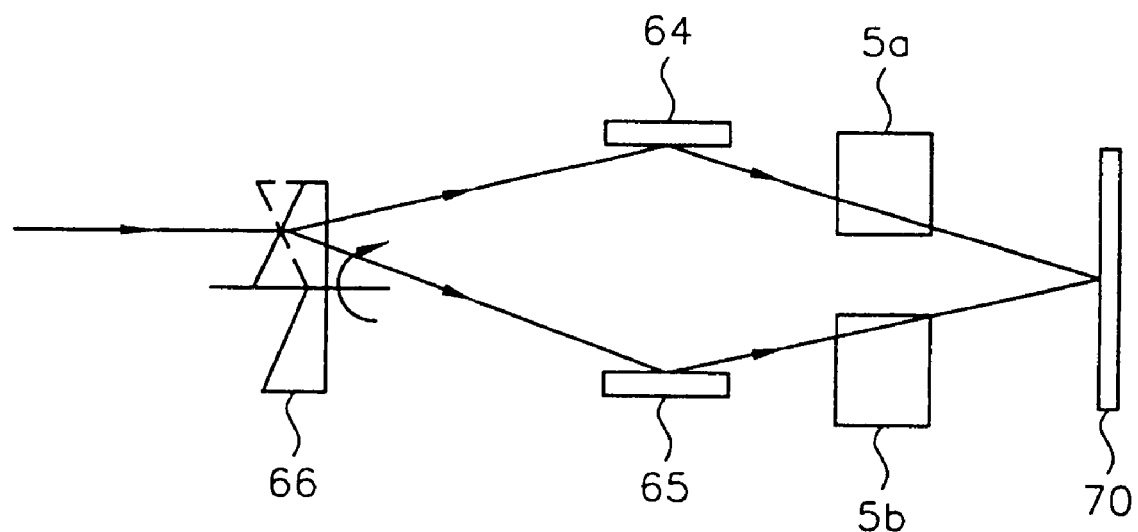
FIG. 30 is a diagram illustrating a configuration of a laser device according to an example of the present invention.

Next, referring to FIG. 30, an example of a three-dimensional laser projection apparatus of the present invention will be described.

This is an apparatus which provides a stereoscopic view for a viewer. FIG. 30 illustrates a configuration of the laser projection apparatus according to the present example. As shown in FIG. 30, by inserting a prism type optical path convertor 66 for three color laser light, the laser light is split into two directions. The split laser light beams are reflected by respective mirrors 64 and 65 and modulated by modulators 5a and 5b, so as to be incident upon the screen 70. An image viewed from the right direction and an image viewed from the left direction are respectively superimposed by the modulators 5a and 5b, and the light beams are incident upon the screen 70 from different directions, thereby being viewed stereoscopically. Moreover, an optical path 1 and an optical path 2 are switched with each other at regular intervals so that a human feels as if different images are coming from two directions, thereby making the stereoscopical image even clearer. As in this example, a stereoscopic image can be easily viewed without stereoscopic glasses.

A stereoscopic view can also be realized by splitting light in two by a half mirror, or the like. Moreover, although a single light source is split in the above example, two laser light sources of the same color may be used to irradiate the screen from different directions. In this case, only half the output is required for each light source.

Next, still another example of a laser projection apparatus of the present invention will be described.

Figure 31:
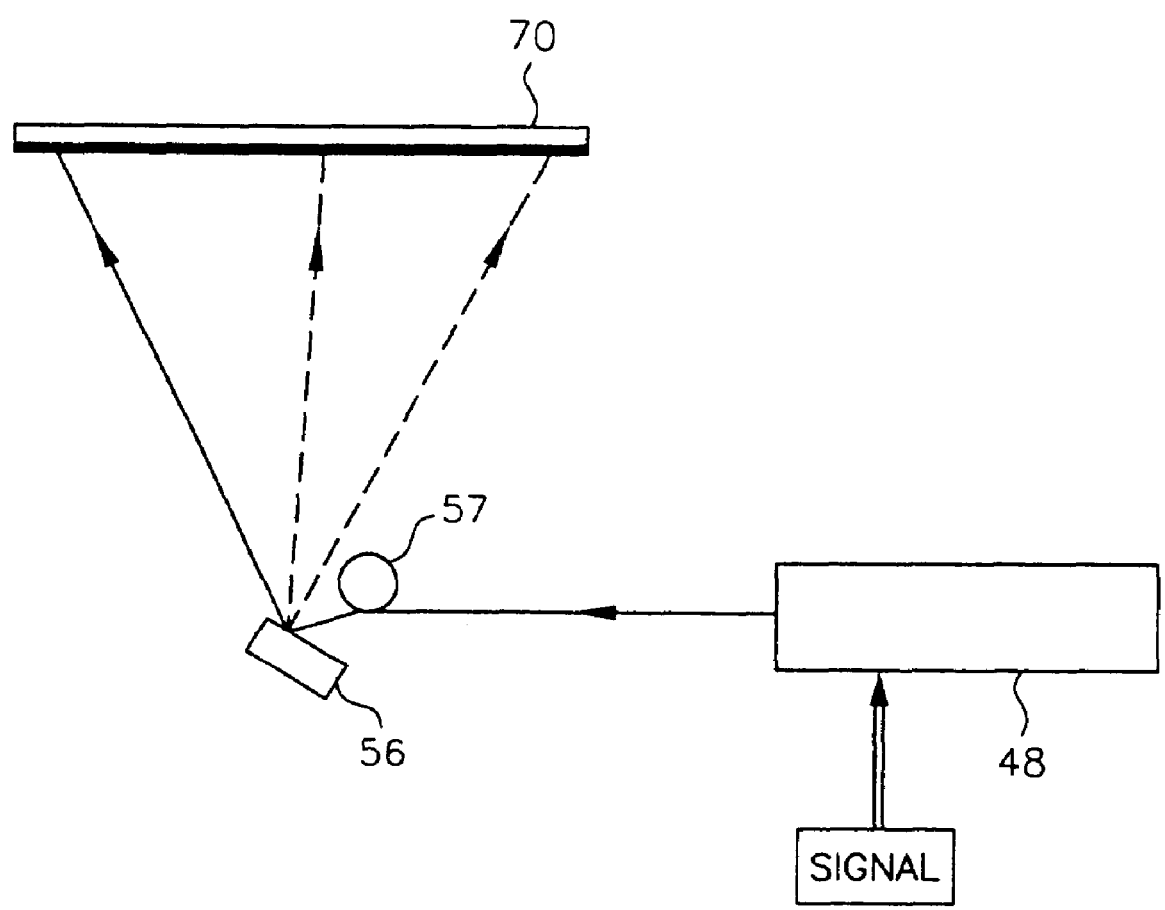
FIG. 31 is a diagram illustrating a configuration of a laser device according to an example of the present invention.

FIG. 31 illustrates a configuration of the laser projection apparatus according to the present example. An ultraviolet laser light source based on the optical wavelength conversion element is used as a light source. By irradiating the screen 70 on which a fluorescent substance is applied with the light, RGB light, i.e., red, green and blue light, is emitted. In the configuration of the laser light source, 650 nm red laser light directly oscillated by a semiconductor laser was made to have half the wavelength, i.e., 325 nm, by an optical wavelength conversion element of LiTaO$_3$. The optical wavelength conversion element is of the bulk type in which the domain inverted structures are formed. Reference numeral 48 denotes the laser light source. Herein, an ultraviolet modulation signal is obtained by directly modulating red semiconductor laser. The modulated ultraviolet laser light enters a deflector. Reference numeral 56 denotes a vertical deflector, and 57 denotes a horizontal deflector, both of which use a rotating polygon mirror. The screen 70 has fluorescent substances applied thereon respectively for generating red, green and blue light, and thus generates fluorescent light. A brightness of 300 cd/m$^2$, a contrast ratio of 100:1 and a horizontal resolution of 600 TV were obtained for a screen size of 1 m×0.5 m. As in this example, it is possible to generate the primary colors, i.e., red, green and blue, with a single laser light source, whereby it is possible to realize smaller size and lower cost. It is also favorable that the dichroic mirror for combining waves can be eliminated.

Figure 32:
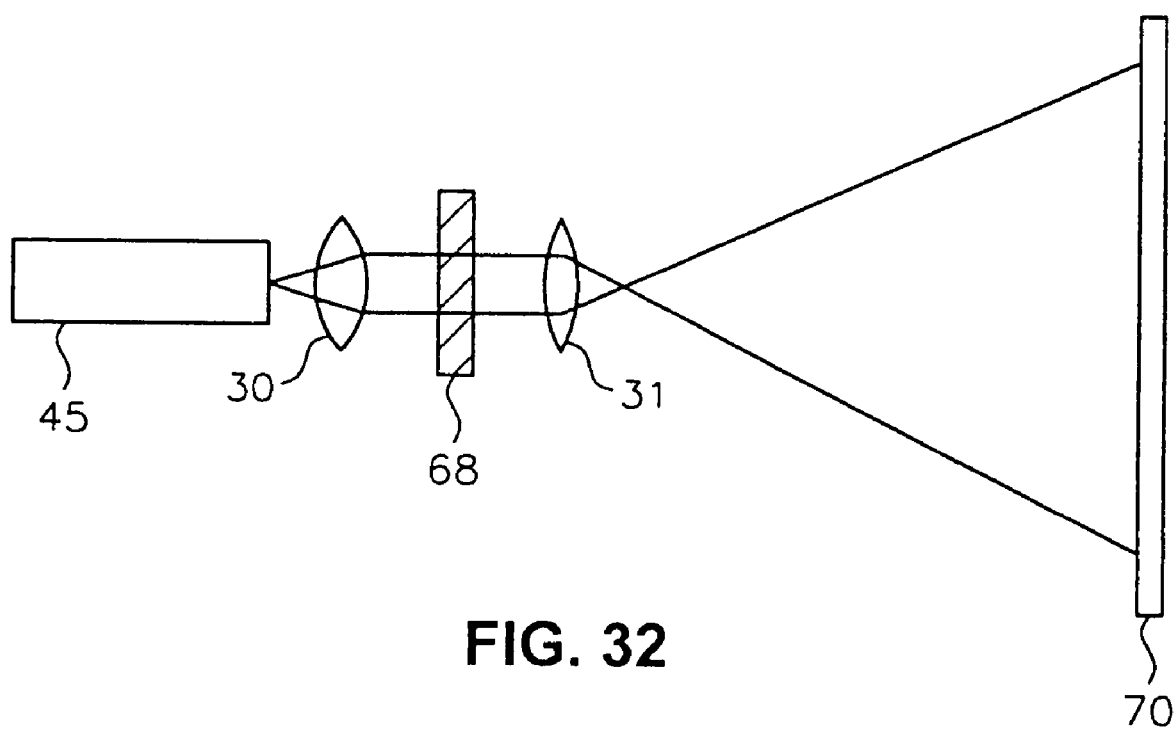
FIG. 32 is a diagram illustrating a configuration of a laser device according to an example of the present invention.

Next, referring to FIG. 32, a laser projection apparatus of the present invention will be described. As shown in FIG. 32, the blue laser light source 45 based on the optical wavelength conversion element is used as a light source. Laser light emitted from the laser light source 45 is collimated by the lens 30. A liquid crystal light bulb 68 is inserted in the collimated laser light. Light is spatially modulated by applying a signal to the liquid crystal light bulb 68, enlarged by the lens 31 and projected onto the screen so that an image can be viewed. This can be done in multi-colors by using laser light sources of the primary colors.

As compared to the conventional technique, the efficiency was considerably improved and the power consumption was reduced. Moreover, it is also advantageous in that the amount of heat generated is small.

Next, referring to FIG. 32, a laser projection apparatus of the present invention will be described. The configuration in appearance is the same as that in the example of the laser projection apparatus illustrated in FIG. 20. As a light source, the blue laser light source of FIG. 23 is used, and the laser light source used herein is RF superimposed. Moreover, the blue light is modulated by an input of a modulation signal in addition to the RF superimposition. The modulated blue laser light is incident upon a deflector. A brightness of 200 cd/m$^2$ was obtained for a screen size of 2 m×1 m using a screen having a gain of 2. A speckle noise to be generated due to laser light interference was not observed on the screen. This results from the reduction of coherency of the laser light by the RF superimposition, and the RF superimposition significantly contributes to countermeasures for the speckle noise. While the laser light source configuration of FIG. 23 is used in the present example, the RF superimposition is effective for a laser projection apparatus using a laser light source based on the direct wavelength conversion of semiconductor laser. Moreover, a speckle noise can also be prevented in the case where red, green or blue laser light is generated directly by semiconductor laser light. It is needless to say that it is also effective for a color laser projection apparatus.

Although LiNbO$_3$ and LiTaO$_3$ are used as a non-linear optical crystal in the above-described example, it is also applicable to use a ferroelectric substance such as KNbO$_3$ or KTP, an organic material such as MNA, and other materials obtained by doping a rare earth element into these materials. Moreover, as a rare earth element, Er or Tl is also prospective in addition to Nd which is used in the examples. Furthermore, although YAG is used as a solid state laser crystal, other crystals such as YLF or YVO$_4$ are also effective. LiSAF and LiCAF are also effective solid state laser crystals.

Figure 33:
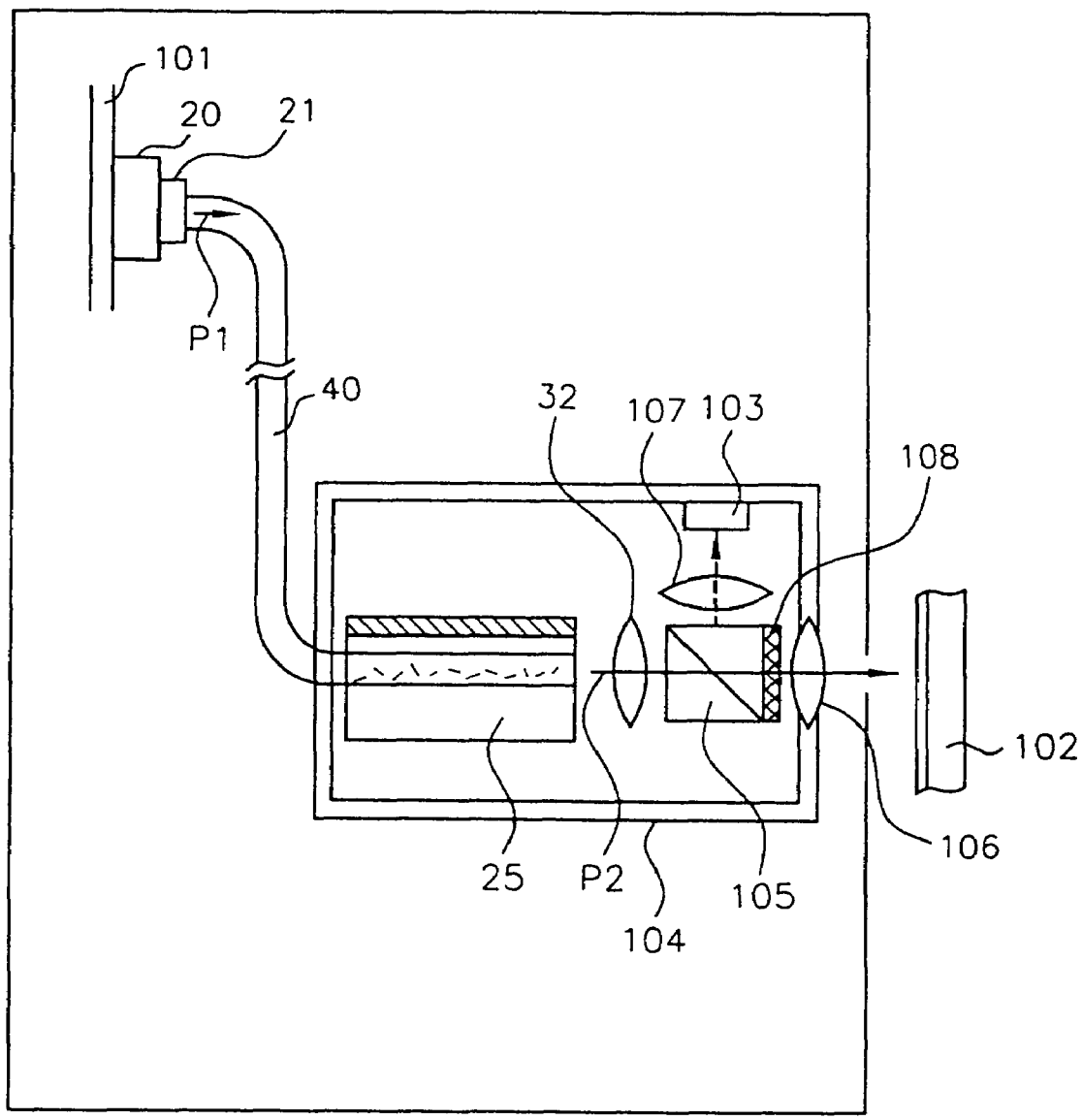
FIG. 33 is a diagram illustrating a configuration of an optical disk apparatus according to an example of the present invention.

Next, referring to FIG. 33, an example where the laser light source of the present invention is applied to an optical disk apparatus will be described.

The optical disk apparatus has the optical wavelength conversion element 25, which includes the domain inverted structures, within an optical pickup 104, whereby the laser light emitted from the semiconductor laser 20 is passed to the optical wavelength conversion element 25 within the optical pickup 104 via the fiber 40.

In addition to the optical wavelength conversion element 25, the optical pickup 104 includes: a collimator lens 32 for converting a harmonic wave emitted from the optical wavelength conversion element 25 to a collimated light; a polarization beam splitter 105 for transmitting the collimated light to the optical disk; a collective lens 106 for collecting the light onto the optical disk; and a detector 103 for detecting reflected light from the optical disk. The polarization beam splitter 105 selectively reflects the reflected light from the optical disk so as to pass it to the detector 103.

While the optical pickup 104 is driven by an actuator, the semiconductor laser 20 is fixed in the optical disk apparatus. The optical pickup 104 can reliably receive, by the flexible optical fiber, laser light from the semiconductor laser 20 fixed in the optical disk apparatus.

Next, the operation will be described.

Light (pumped light) emitted from the semiconductor laser 20 is converted to the fundamental wave P1 by the solid state laser 21, and radiated onto the optical wavelength conversion element 25. The optical wavelength conversion element 25 has a configuration similar to that in the above-described example and converts the fundamental wave P1 to the harmonic wave P2. The harmonic wave P2 is collimated by the collimator lens 32, passes through the polarization beam splitter 105, and is then collected onto the optical disk medium 102 via the collective lens 106. The reflected light from the optical disk medium 102 returns by the same optical path again, is reflected by the polarization beam splitter 105, and is detected by the detector 103.

Thus, a signal can be recorded on the optical disk medium, or a signal recorded thereon can be reproduced.

A quarter-wave plate 108 is inserted between the polarization beam splitter 105 and the collective lens 106 so as to rotate a polarization direction of a harmonic wave by 90 degrees on its way out and on its way back in.

When a semiconductor laser having an output of 1 W was used as the semiconductor laser 20, a harmonic wave P2 of 200 mW was obtained. The wavelength of light emitted from the solid state laser 21 is 947 nm, and the wavelength of the harmonic wave is 473 nm.

By using high power laser light having an output of 200 mW, it is possible to perform a recording operation at a speed 10 times faster than the recording speed achieved by an optical disk apparatus using conventional 20 mW output light. The transfer rate was 60 Mbps.

Moreover, the semiconductor laser 20 which generates heat during operation is fixed in a housing of the optical disk apparatus, and is remote from the optical pickup. Thus, as a result of removal of the semiconductor laser from the optical pickup, it is no longer necessary to provide a special heat release structure for a semiconductor laser. It is thus possible to compose a subminiature and light weight optical pickup. As a result, the optical pickup can be driven by an actuator at a high speed, whereby a fast recording operation at a high transfer rate can be achieved.

Although the solid state laser is located on the side of the semiconductor laser in the present example, it may also be located on the side of the optical wavelength conversion element. Moreover, it is applicable to convert light from the semiconductor laser as a fundamental wave directly to a harmonic wave without using a solid state laser.

The internal structure of the optical pickup 104 is not limited to that of the present example. For example, by using a polarization separating hologram, it is possible to eliminate a lens and a polarization beam splitter. Thus, the optical pickup can be made further smaller.

INDUSTRIAL APPLICABILITY

As described above, in the optical wavelength conversion element of the present invention, after an optical element is produced in an LiNb$_x$Ta$_{1-x}$O$_3$ ($0 \leq X \leq 1$) substrate, low-temperature annealing is performed so as to repress an increase in refractive index generated during a heat treatment such as high-temperature annealing, and then, a stable proton exchange layer is formed, whereby a stable optical element can be formed. Particularly, the present invention is indispensable for putting into practical use an optical wavelength conversion element whose phase-matched wavelength varies with refractive index variation.

Moreover, the 2-stage annealing with two different temperatures is effective as the low-temperature annealing since it enables a stable proton exchange layer such that there is completely no temporal variation to be restored quickly. It is further effective since the strain can be greatly mitigated and a stable proton exchange layer can be formed by performing second annealing at a temperature lower than that in first annealing by 200° C. It is further effective since the temporal variation is 0.5 nm or less if the low-temperature annealing is performed for at least 1 hour at a temperature of 120° C. or lower, and it is particularly effective if the temperature is 90° C. or less, whereby the phase-matched variation is small. If the temperature is 50° C. or lower, there will be a problem of an extremely long annealing time. Therefore, the annealing needs to be performed at a temperature thereabove.

Moreover, with the laser light source of the present invention, it is possible to stabilize the oscillation wavelength of the semiconductor laser and to increase the fundamental wave output by inserting a semiconductor laser amplifier between a distributed feedback type semiconductor laser and an optical wavelength conversion element, while it is also possible to stably obtain the maximum harmonic wave output by using the highly efficient optical wavelength conversion element having domain inverted layer structures.

Furthermore, with the laser light source of the present invention, the optical wavelength conversion element section can be made very compact by designing it so that pumped light or a fundamental wave propagates through a fiber. Furthermore, it is possible to remotely dispose the optical wavelength conversion element away from the heat generated by the semiconductor laser and thus to prevent temperature variation, whereby a high output semiconductor laser can be used.

Moreover, if periodic domain inverted structures are used as the optical wavelength conversion element, in addition to a significantly improved conversion efficiency, modulation can be easily effected by applying a low voltage, thereby presenting an industrial advantage. Thus, a modulator can be integrated, whereby it is possible to achieve smaller size, lighter weight and lower cost. Furthermore, by employing an optical waveguide with a weak confinement as the optical wavelength conversion element, the concentration of a harmonic wave becomes small, whereby the optical damage is considerably improved. This is because, a 100 times larger area with respect to that in a conventional technique can tolerate a 100 times greater optical damage. Furthermore, with the laser light source of the present invention, it is possible to use a high output semiconductor laser of a multi-stripe or wide-stripe type by converting pumped light to a fundamental wave using a solid state laser crystal, whereby it is possible to obtain a high output harmonic wave.

Because of these factors, it is possible, for example, to obtain a total conversion efficiency of 20% by amplifying the electro-optical conversion efficiency of the semiconductor laser of 30% with the conversion efficiency of an optical wavelength conversion element of 70%. Moreover, by RF superimposing a semiconductor laser in the laser light source of the present invention, the conversion efficiency is improved by 5-fold, for example, as compared to the case when the RF superimposition is not performed.

Furthermore, with the laser projection apparatus of the present invention, since it is based on a semiconductor laser, it is possible to achieve considerably smaller size, lighter weight and lower cost. Moreover, it is possible to simultaneously achieve a smaller size, a lighter weight and a lower cost of the apparatus by using a high output laser light source based on a semiconductor laser and an optical wavelength conversion element. Furthermore, the power consumption can also be extremely low. One of the factors therefor is that the apparatus does not separately has a modulator for laser light, which, instead, is integrated with the optical wavelength conversion element. Furthermore, as compared to a conventional technique, the resolution is considerably improved. For example, as compared to a configuration using a gas laser, considerable improvements are achieved such as a one thousandth weight, a one-thousandth volume and a one-hundredth power consumption. The small size and the low power consumption of the employed laser light source and the integration thereof with the optical modulator greatly contribute to these achievements. That is, this results from that the configuration using a semiconductor laser and an optical wavelength conversion element can be subminiaturized while the efficiency of conversion from an electrical power is higher than that of a gas laser by about two orders of magnitude. Particularly, it is significantly effective to use an element having periodic domain inverted structures as an optical wavelength conversion element, since this makes it possible to improve efficiency and realize integration of the optical modulator driven with a low voltage.

Furthermore, it is possible to generate the primary colors by allowing fluorescent substances to be irradiated with an ultraviolet laser light source, and thus to achieve an even smaller size and lower cost, thereby presenting a significant industrial advantage. Thus, it is possible to generate the primary colors, i.e., red, green and blue, with a single laser light source. It is also favorable that the dichroic mirror for combining waves can be eliminated.

Furthermore, when scanning is terminated, the laser projection apparatus of the present invention prevents a certain position from being irradiated with laser light in a concentrated manner, thereby presenting a laser light termination or cutting function. Moreover, if the signal from a sensor is interrupted even for a moment, the power of the laser light source is turned off by a control circuit. Thus, it is safe since a human, etc., never touches the short wavelength laser light having a high output. The safety of this laser projection apparatus is maintained as described above.

Furthermore, the RF superimposition is effective for a laser projection apparatus using a laser light source based on direct wavelength conversion of a semiconductor laser. This is because a speckle noise can be prevented from being generated, whereby a clear image can be reproduced. Moreover, a speckle noise can also be prevented in the case where red, green or blue laser light is generated directly by semiconductor laser light.

The invention claimed is:
1. A laser device, comprising:
    a laser light source having a semiconductor laser for radiating laser light, a bulk type optical wavelength conversion element for generating a harmonic wave based on the laser light and a single mode fiber for conveying laser light from the semiconductor laser to the optical wavelength conversion element;
    a modulator for modulating an output intensity of the harmonic wave; and
    a deflector for changing a direction of the harmonic wave emitted from the laser light source,
    wherein periodic domain inverted structures are formed in the optical wavelength conversion element,
    wherein the single mode fiber is configured to prevent a variation in temperature of the optical wavelength conversion element caused by a heat generated from the semiconductor laser, the semiconductor laser being remote from the optical wavelength conversion element.
2. A laser device according to claim 1, wherein:
    the semiconductor laser is a distributed feedback type semiconductor laser; and the laser light source further comprises a semiconductor laser amplifier for amplifying the laser light from the distributed feedback type semiconductor laser.

3. A laser device, comprising:
three laser light sources for generating red, green and blue laser light beams;
a modulator for changing an intensity of each of the laser light beams; and
a deflector for changing a direction of each of the laser light beams,
wherein at least one of the three laser light sources is formed of a semiconductor laser a bulk type optical wavelength conversion element having periodic domain inverted structures and a single mode fiber for conveying laser light from the semiconductor laser to the optical wavelength conversion element,
wherein the single mode fiber is configured to prevent a variation in temperature of the optical wavelength conversion element caused by a heat generated from the semiconductor laser, the semiconductor laser being remote from the optical wavelength conversion element.

4. A laser device according to claim 3, wherein the optical wavelength conversion element receives the laser light from the fiber as a fundamental wave, and generates a harmonic wave based on the fundamental wave.

5. A laser device according to claim 3, wherein the semiconductor laser is a distributed feedback type laser, and the laser light source further comprises a semiconductor laser amplifier for amplifying laser light from the distributed feedback type semiconductor laser.

6. A laser device according to claim 1, wherein:
an optical waveguide is further formed in the optical wavelength conversion element; and
a width and a thickness of the optical waveguide are each 40 μm or greater.

7. A laser device according to claim 3, wherein an optical waveguide for guiding the laser light is further formed in the optical wavelength conversion element, and
a width and a thickness of the optical waveguide are each 40 μm or greater.

8. A laser device according to claim 1,
wherein the semiconductor laser is fixed in a housing without active cooling.

9. A laser device according to claim 3,
wherein the semiconductor laser is fixed in a housing without active cooling.

* * * * *

UNITED STATES PATENT AND TRADEMARK OFFICE
CERTIFICATE OF CORRECTION

PATENT NO. : 7,382,811 B2  Page 1 of 1
APPLICATION NO. : 10/712635
DATED : June 3, 2008
INVENTOR(S) : Yamamoto et al.

It is certified that error appears in the above-identified patent and that said Letters Patent is hereby corrected as shown below:

On Page 2, item [56], References Cited, "JP 06-194708 7/1995" should read
--JP 06-194708 7/1994--

On Page 2, item [56], References Cited, OTHER PUBLICATIONS: "Ahfeldt, H., et al.," should read --Ahlfeldt, H., et al.,--

Signed and Sealed this

Ninth Day of September, 2008

JON W. DUDAS
*Director of the United States Patent and Trademark Office*